US012810925B2

(12) United States Patent
Kim et al.

(10) Patent No.: US 12,810,925 B2
(45) Date of Patent: Nov. 24, 2026

(54) MEMORY DEVICE AND MEMORY SYSTEM

(71) Applicant: SAMSUNG ELECTRONICS CO., LTD., Suwon-si (KR)

(72) Inventors: Ki-Heung Kim, Suwon-si (KR); ChangSik Yoo, Suwon-si (KR); Jeongdon Ihm, Suwon-si (KR); Hyongryol Hwang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 63 days.

(21) Appl. No.: 18/806,022

(22) Filed: Aug. 15, 2024

(65) Prior Publication Data

US 2025/0061939 A1 Feb. 20, 2025

(30) Foreign Application Priority Data

Aug. 18, 2023 (KR) ........................ 10-2023-0108499
Feb. 16, 2024 (KR) ........................ 10-2024-0022920

(51) Int. Cl.
*G11C 11/4096* (2006.01)
*G11C 11/408* (2006.01)

(52) U.S. Cl.
CPC ...... *G11C 11/4096* (2013.01); *G11C 11/4087* (2013.01)

(58) Field of Classification Search
CPC ........................ G11C 11/4096; G11C 11/4087
USPC ..................................................... 365/189.18
See application file for complete search history.

(56) References Cited

U.S. PATENT DOCUMENTS

| | | | | |
|---|---|---|---|---|
| 8,984,212 | B2 * | 3/2015 | Choi | G06F 12/0246 711/103 |
| 10,534,704 | B2 | 1/2020 | Park et al. | |
| 10,586,576 | B2 | 3/2020 | Nakaoka | |
| 11,200,118 | B2 | 12/2021 | Buerkle et al. | |
| 11,231,991 | B2 | 1/2022 | Heo et al. | |
| 11,281,574 | B2 | 3/2022 | Hwang et al. | |
| 11,288,188 | B1 | 3/2022 | Tummala et al. | |
| 11,749,333 | B2 | 9/2023 | Kim | |
| 2009/0251954 | A1 | 10/2009 | Wang et al. | |
| 2012/0297256 | A1 | 11/2012 | Plondke et al. | |
| 2013/0019051 | A1 | 1/2013 | Somanache et al. | |

(Continued)

FOREIGN PATENT DOCUMENTS

| | | |
|---|---|---|
| KR | 10-2020-0122685 | 10/2020 |
| KR | 10-2022-0082730 | 6/2022 |

(Continued)

OTHER PUBLICATIONS

Extended European Search Report in European Appln. No. 24194828.0, mailed on Jan. 31, 2025, 11 pages.

*Primary Examiner* — Alexander Sofocleous
*Assistant Examiner* — Duy H Luong
(74) *Attorney, Agent, or Firm* — Fish & Richardson P.C.

(57) ABSTRACT

A memory device includes at least one bank including a first sub-bank and a second sub-bank disposed in a wordline direction. The first sub-bank may store normal data and may be connected to a plurality of first wordlines, the second sub-bank may store metadata corresponding to the normal data and may be connected to a plurality of second wordlines, and metadata for normal data corresponding to each of the first wordlines may be stored in each of second wordlines, respectively corresponding to the first wordlines.

17 Claims, 28 Drawing Sheets

(56) References Cited

U.S. PATENT DOCUMENTS

| | | | | |
|---|---|---|---|---|
| 2016/0027492 | A1* | 1/2016 | Byun | G11C 8/10 365/222 |
| 2017/0110161 | A1* | 4/2017 | Seo | G11C 11/4085 |
| 2021/0286727 | A1 | 9/2021 | Bains | |
| 2021/0357322 | A1 | 11/2021 | Shveidel et al. | |
| 2022/0165326 | A1* | 5/2022 | Ware | G06F 12/0895 |
| 2023/0205428 | A1 | 6/2023 | Kim et al. | |
| 2024/0160351 | A1* | 5/2024 | Ayyapureddi | G06F 11/1048 |

FOREIGN PATENT DOCUMENTS

| | | |
|---|---|---|
| KR | 10-2023-0099477 | 7/2023 |
| KR | 10-2557993 | 7/2023 |

* cited by examiner

FIG. 10

| SB1_1 | | | | SB2_1 | | |
|---|---|---|---|---|---|---|
| WL | CSL | Data | | Data | CSL | WL |
| 1_0 | 0~14 | Normal Data | → | Meta Data | 60 | 2_0 |
| | 15~29 | Normal Data | → | Meta Data | 61 | |
| | 30~44 | Normal Data | → | Meta Data | 62 | |
| | 45~59 | Normal Data | → | Meta Data | 63 | |
| 1_1 | 0~14 | Normal Data | → | Meta Data | 60 | 2_1 |
| | 15~29 | Normal Data | → | Meta Data | 61 | |
| | 30~44 | Normal Data | → | Meta Data | 62 | |
| | 45~59 | Normal Data | → | Meta Data | 63 | |

MEMORY DEVICE AND MEMORY SYSTEM

CROSS-REFERENCE TO RELATED APPLICATION(S)

This application claims priority to Korean Patent Application Nos. 10-2023-0108499, field on Aug. 18, 2023, and 10-2024-0022920, filed on Feb. 16, 2024, in the Korean Intellectual Property Office, the disclosures of which are herein incorporated by reference in their entirety.

BACKGROUND

Memory devices are used to store data and are classified into volatile and nonvolatile memory devices. Volatile memory devices lose their stored data when their power supplies are interrupted. A dynamic random access memory (DRAM) is a volatile memory device used in various fields, such as mobile systems, servers, and graphics devices.

Memory devices may store metadata, and there is a need for a method to efficiently assign resources of the memory devices to the metadata.

SUMMARY

In general, in some aspects, the present disclosure is directed toward a memory device for reducing an increase in area caused by assignment of metadata or a row hammer effect for an access to the metadata.

According to some implementations, the present disclosure is directed to a memory device that includes at least one bank including a first sub-bank and a second sub-bank disposed in a wordline direction. The first sub-bank may store normal data and may be connected to a plurality of first wordlines, the second sub-bank may store metadata corresponding to the normal data and may be connected to a plurality of second wordlines, and metadata for normal data corresponding to each of the first wordlines may be stored in each of second wordlines, respectively corresponding to the first wordlines.

According to some implementations, the present disclosure is directed to a memory device that includes at least one bank including at least a first sub-bank and a second sub-bank disposed in a wordline direction, a first row decoder connected to the first sub-bank through a plurality of first wordlines, and a second row decoder connected to the second sub-bank through a plurality of second wordlines. Based on the first row decoder selecting a single first wordline from among the first wordlines to write normal data in the first sub-bank, the second row decoder may select a single second wordline, corresponding to the first single wordline, from among the second wordlines to write metadata corresponding to the normal data.

According to some implementations, the present disclosure is directed to a memory system that includes a memory device, including at least one bank including at least a first sub-bank and a second sub-bank disposed in a wordline direction, and a memory controller configured to control the memory device. The first sub-bank may store normal data and may be connected to a plurality of first wordlines, the second sub-bank may store metadata corresponding to the normal data and may be connected to a plurality of second wordlines, and metadata for normal data corresponding to each of the first wordlines may be stored in each of the second wordlines, respectively corresponding to the first wordlines.

BRIEF DESCRIPTION OF DRAWINGS

Example implementations will be more clearly understood from the following detailed description, taken in conjunction with the accompanying drawings.

FIG. 10 is a diagram illustrating an example of an assignment of wordlines and column select lines in sub-banks within the same bank according to some implementations.

DETAILED DESCRIPTION

Hereinafter, example implementations will be explained in detail with reference to the accompanying drawings.

Figure 1:
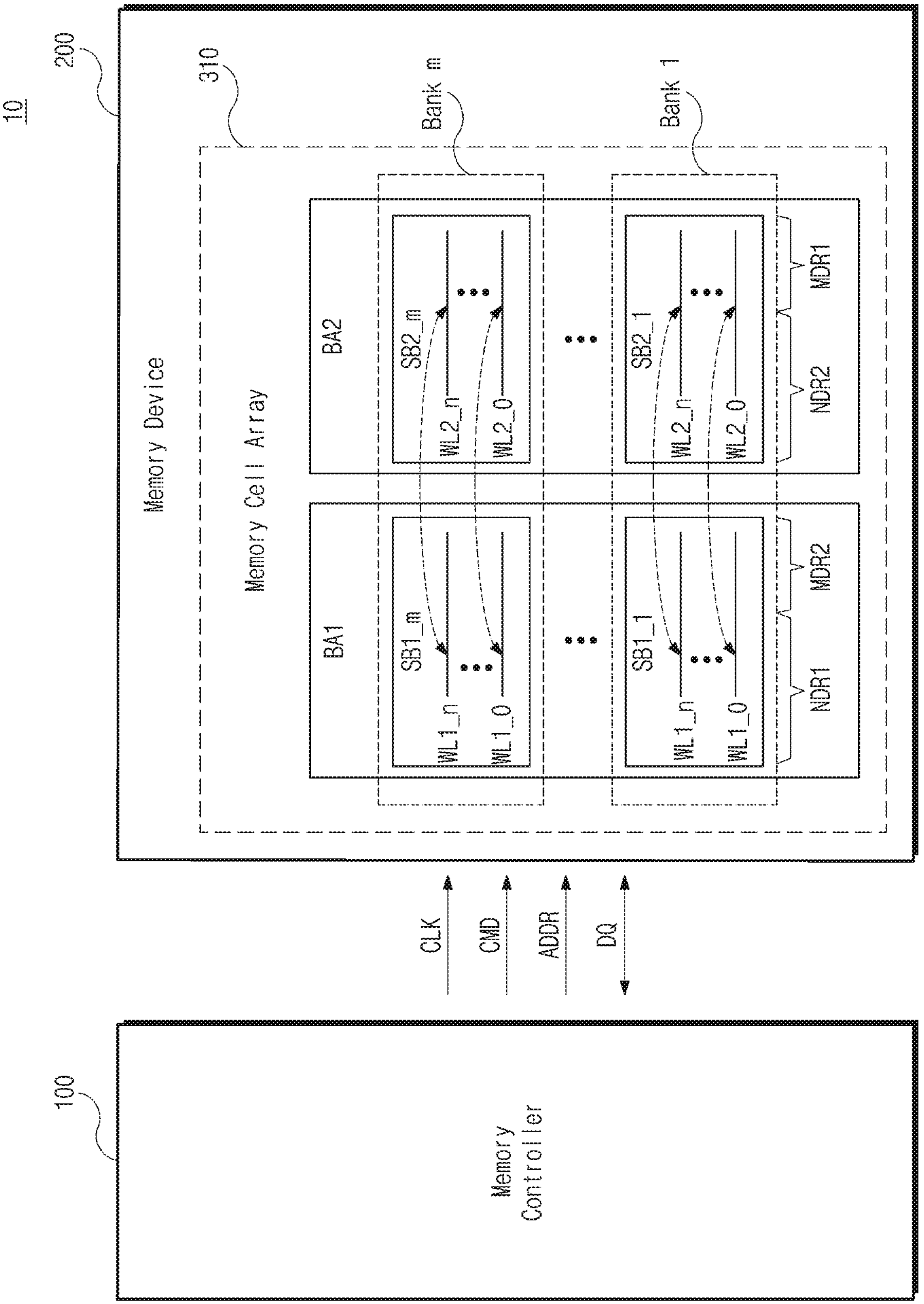
FIG. 1 is a diagram illustrating an example of a memory system according to some implementations.

FIG. 1 is a diagram illustrating an example of a memory system according to some implementations. In FIG. 1, a memory system 10 may include a memory controller 100 and a memory device 200.

The memory controller 100 may control the overall operation of the memory system 10 and control data exchange between a host device, connected to the memory system 10, and the memory device 200. For example, the memory controller 100 may control the memory device 200 to write or read data in response to a request from the host device.

The memory controller 100 may transmit a command CMD, a clock signal CLK, an address ADDR, or the like, to control the memory device 200. In addition, the memory controller 100 may provide data DQ to the memory device 200 and receive data DQ from the memory device 200.

The data DQ may include normal data and metadata. The metadata may be defined as data used to improve the performance of the memory device 200 or to enhance security of the memory device 200. In some implementations, the metadata may include information on the type, length, and attributes of corresponding normal data, but the present disclosure is not limited thereto.

The memory device 200 may receive the data DQ from the memory controller 100 and store the received data. In some implementations, the memory device 200 may receive normal data from the memory controller 100, generate metadata for the normal data, and store the normal data and the metadata together. The memory device 200 may read the stored data DQ in response to a request from the memory controller 100 and transmit the read data to the memory controller 100.

In some implementations, the memory device 200 may be a memory device including volatile memory cells. For example, the memory device 200 may be one of various DRAM devices, such as a double data rate synchronous dynamic random access memory (DDR SDRAM) device, a DDR2 SDRAM device, a DDR3 SDRAM device, a DDR4 SDRAM device, a DDR5 SDRAM device, a DDR6 SDRAM device, a low power double data rate (LPDDR) SDRAM device, an LPDDR2 SDRAM device, an LPDDR3 SDRAM device, an LPDDR4 SDRAM device, an LPDDR4X SDRAM device, an LPDDR5 SDRAM device, a graphics double data rate synchronous graphics random access memory (GDDR SGRAM) device, a GDDR2 SGRAM device, a GDDR3 SGRAM device, a GDDR4 SGRAM device, a GDDR5 SGRAM device, or a GDDR6 SGRAM device.

In some implementations, the memory device 200 may be a stacked memory device in which DRAM dies are stacked, such as a high bandwidth memory (HBM) device, an HBM2 device, or an HBM3 device.

In some implementations, the memory device 200 may be a memory module, such as a dual in-line memory module (DIMM). For example, the memory module 100A may be a registered DIMM (RDIMM), a load reduced DIMM (LRDIMM0, an unbuffered DIMM (UDIMM), a fully buffered DIMM (FB-DIMM), a small outline DIMM (SO-DIMM). However, this is only an example, and the memory device 200 may be another memory module such as a single in-line memory module (SIMM).

In some implementations, the memory device 200 may be an SRAM device, a NAND flash memory device, a NOR flash memory device, an RRAM device, an FRAM device, a PRAM device, a TRAM device, or an MRAM device.

The memory device 200 may include a memory cell array 310. The memory cell array 310 may include a plurality of banks Bank 1 to Bank n. Each bank may include a plurality of memory cells connected to a plurality of word lines WL1_1 to WL1_*n* and WL2_1 to WL2_*n*.

For ease of description, an example will be provided in which each bank includes DRAM cells. However, this is only an example, and each of the plurality of banks Bank 1 to Bank m may be implemented to include volatile memory cells other than DRAM cells. In addition, each of the plurality of banks Bank 1 to Bank n may be implemented to include the same type of memory cells, or may be implemented to include different types of memory cells.

Each of the plurality of banks Bank 1 to Bank m may include sub-banks disposed in a wordline direction. For example, the first bank Bank 1 may include a 1_1-th sub-bank SB1_1 and a 2_1-th sub-bank SB2_1. Similarly, the mth bank Bank m may include a first sub-bank SB1_*m* and a second sub-bank SB2_*m*.

The first sub-banks SB1_1 to SB1_*m* may constitute a first bank array BA1, and the second sub-banks SB2_1 to SB2_*m* may constitute a second bank array BA2.

In some implementations, first metadata corresponding to first normal data stored in the first sub-bank SB1_1 may be stored in the second sub-bank SB2_1. Within the first sub-bank SB 1_1, a region in which the first normal data is stored may be referred to as a first normal region NDR1. Within the 2_1-th sub-bank SB2_1, a region in which the first metadata corresponding to the first normal data is stored may be referred to as a first meta region MDR1.

Similarly, second metadata corresponding to second normal data stored in the 2_1-th sub-bank SB2_1 may be stored in the 1_1-th sub-bank SB1_1. Within the 2_1-th sub-bank SB2_1, a region in which the second normal data is stored may be referred to as a second normal region NDR2. Within the 1_1-th sub-bank SB1_1, a region in which the second metadata corresponding to the second normal data is stored may be referred to as a second meta region MDR2.

For example, each sub-bank within the same bank may be regarded as a normal-side sub-bank and a meta-side sub-bank with respect to an opposite sub-bank.

The 1_1-th sub-bank SB1_1 and the 2_1-th sub-bank SB2_1 may not share a global input/output line (GIO). Accordingly, a data operation on the first metadata may be performed substantially contemporaneously or simultaneously in the 2_1-th sub-bank SB2_1 while a data operation on the first normal data is performed in the 1_1-th sub-bank SB1_1. Additionally, a data operation on the second metadata may be performed substantially contemporaneously or simultaneously in the 1_1-th sub-bank SB1_1 while a data operation on the second normal data is performed in the 2_1-th sub-bank SB2_1. Data operations may include a data write operation and a data read operation, but example embodiments are not limited thereto.

Each of the first normal region NDR1 and second metadata area MDR2 of the 1_1-th sub-bank SB1_1 may be connected to a plurality of first wordlines WL1_1 to WL1_*n*, and each of the first meta region MDR1 and the second normal region NDR2 of the 2_1-th sub-bank SB2_1 may be connected to a plurality of second wordlines WL2_1 to WL2_*n*.

In some implementations, each of the first metadata for the first normal data corresponding to each of the first wordlines may be stored in each of the second wordlines corresponding to each of the first wordlines. Hereinafter, for convenience, "data being stored in a wordline" may refer to data being stored in memory cells corresponding to (e.g., connected to) the wordline. For example, "each of the first metadata for the first normal data corresponding to each of the first wordlines may be stored in each of the second wordlines corresponding to each of the first wordlines" may mean "each of the first metadata for the first normal data stored in memory cells corresponding to each of the first wordlines may be stored in memory cells corresponding to each of the second wordlines that correspond to each of the first wordlines."

For example, each of the first wordlines WL1_1 to WL1_*n*, connected to the first normal region NDR1 in which the first normal data is stored, may correspond to each of the second wordlines WL2_1 to WL2_*n* connected to the first meta region MDR1 in which the first metadata is stored.

For example, the first metadata for the first normal data stored in a region connected to the 1_1-th wordline WL1_1 may be stored in the 2_1-th wordline WL2_1 corresponding to the 1_1-th wordline WL1_1. Similarly, the first metadata for the first normal data stored in a region connected to the 1_n-th wordline WL1_*n* may be stored in the 2_n-th wordline WL2_*n* corresponding to the 1_n-th wordline WL1_*n*.

Similarly, each of the second metadata for the second normal data corresponding to each of the second wordlines may be stored in each of the first wordlines corresponding to each of the second wordlines.

For example, the second metadata for the second normal data stored in a region connected to the 2_1-th wordline WL2_1 may be stored in the 1_1-th wordline WL1_1 corresponding to the 2_1-th wordline WL2_1. The second metadata for the second normal data stored in the area connected to the 2_n-th wordline WL2_*n* may be stored in the 1_n-th wordline WL1_*n* corresponding to the 2_n-th wordline WL2_*n*.

For example, wordlines of one sub-bank and wordlines of another sub-bank, included in the same bank, may form wordline pairs.

Accordingly, the metadata for the normal data stored in the 1_1-th sub-bank SB1_1 may be distributed and stored in corresponding wordlines of the 2_1-th sub-bank SB2_1 and may not be concentrated and stored in a specific wordline of the 2_1-th sub-bank SB2_1. Additionally, the metadata for the normal data stored in the 2_1-th sub-bank SB2_1 may be distributed and stored in corresponding wordlines of the 1_1-th sub-bank SB1_1 and may not be concentrated and stored in a specific wordline of the 1_1-th sub-bank SB1_1.

In some implementations, the memory device 200 may operate in first mode or second mode. The first mode may be operating mode in which meta is input or output metadata. The second mode may be a state in which the first mode is turned off, and may correspond to normal mode. The memory controller 100 may adjust a specific bit value of a storage space, such as a mode register included in the memory device 200, to control the memory device 200 operating in first mode or second mode. For example, when the specific bit value is set to a first value (for example, 1), the memory device may operate in first mode. When the specific bit value is set to a second value (for example, 0), the memory device may operate in second mode.

When operating in the first mode, the memory system 10 may perform a write or read operation based on wordlines and column select lines assigned for metadata according to various embodiments to be described below (FIGS. 2 to 23).

In second mode, the wordlines and the column select lines assigned for metadata in first mode may also be assigned for normal data. In second mode, the memory system 10 may activate at least a portion of the plurality of wordlines included in the memory device 200 to write or read normal data in or from the memory device 200. The operation of the memory system 10 in second mode may follow the operation in DRAM, DDR4, SDRAM, DDR5 SDRAM, DDR6 SDRAM, LPDDR4 SDRAM, LPDDR5 SDRAM, or LPDDR6 SDRAM.

As described above, metadata may be assigned to a portion of each sub-bank, and normal data and metadata for the normal data may be stored in different sub-banks, respectively. Accordingly, chip size overhead caused by additional registers or lines for metadata may be reduced. In addition, when a data operation on normal data is performed in one sub-bank, a data operation on metadata may be performed substantially simultaneously in another sub-bank, and thus timing loss may be reduced. In some implementations, the metadata for the normal data stored in one sub-bank may be distributed and stored in the corresponding wordline in another sub-bank, and may not be concentrated and stored in a specific wordline in another sub-bank. Accordingly, the row hammer effect caused by repeated access to a specific wordline for metadata access may be reduced.

Figure 2:
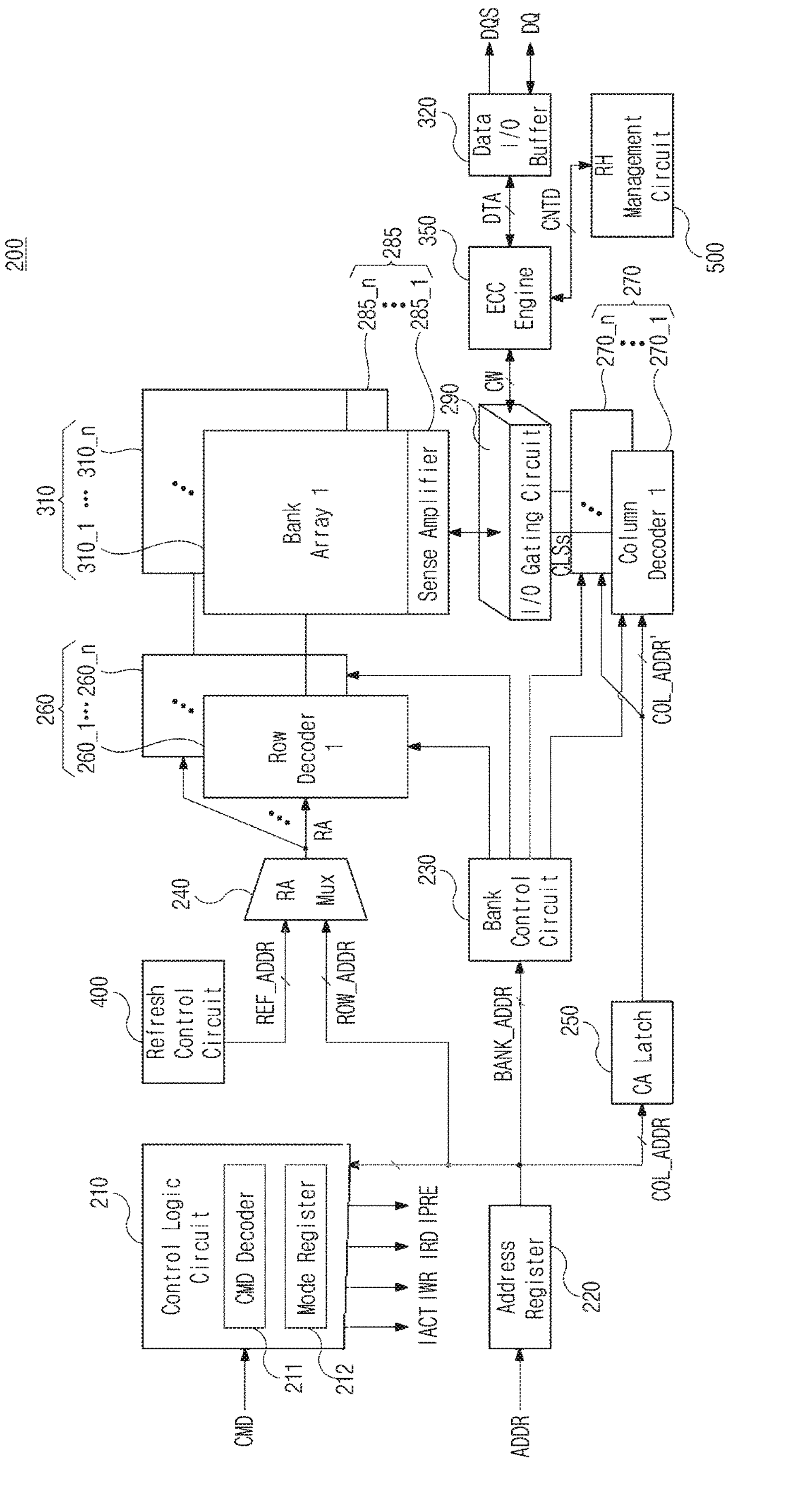
FIG. 2 is a block diagram of an example of a memory device according to some implementations.

FIG. 2 is a block diagram illustrating an example of a memory device according to some implementations. The memory device 200 of FIG. 2 may correspond to the memory device 200 of FIG. 1.

In FIG. 2, the memory device 200 may include a control logic circuit 210, an address register 220, a bank control logic 230, a refresh control circuit 400, a row address multiplexer 240, a column address latch 250, a row decoder group 260, a column decoder group 270, a memory cell array 310, a sense amplifier unit 285, an input/output (I/O) gating circuit 290, an error correction code (ECC) engine 350, a data input/output (I/O) buffer 320, and a row hammer management circuit 500.

The memory cell array 310 may include a plurality of bank arrays 310_1 to 310_*n*. Each of the plurality of bank arrays 310_1 to 310_*n* may include a plurality of memory cells.

The first bank array BA1 illustrated in FIG. 1 may correspond to one of the plurality of bank arrays 310_1~310_*k* illustrated in FIG. 2.

The row decoder group 260 may include a plurality of row decoders 260_1 to 260_*n*. Each of the plurality of row decoders 260_1 to 260_*n* may be connected to a corresponding bank array, among the plurality of bank arrays 310_1 to 310_*n*.

The sense amplifier unit 285 may include a plurality of sense amplifiers 285_1 to 285_*n*. Each of the plurality of sense amplifiers 285_1 to 285_*n* may be connected to a corresponding bank array, among the plurality of bank arrays 310_1 to 310_*n*.

The column decoder group 270 may include a plurality of column decoders 270_1 to 270_*n*. Each of the plurality of column decoders 270_1 to 270_*n* may be connected to a corresponding bank array, among the plurality of bank arrays 310_1 to 310_*n*, through column select lines CLS.

In some implementations, each of the plurality of bank arrays 310_1 to 310_*n* may include a plurality of sub-banks. Each bank may be defined to include different sub-banks from different bank arrays. For example, each of the plurality of bank arrays 310_1 to 310_*n* may include a plurality of sub-banks disposed in a column direction. The first bank may be defined as including one of the plurality of sub-banks of the first bank array 310_1 and one of the plurality of sub-banks of the second bank array 310_2. However, this is only an example, and the number of sub-banks included in a bank may be defined in various ways according to some implementations.

The address register 220 may receive an address ADDR including a bank address BANK_ADDR, a row address ROW_ADDR, and a column address COL_ADDR from the memory controller 100. The address register 220 may provide the received bank address BANK_ADDR to the bank control logic 230, the received row address ROW_ADDR to the row address multiplexer 240, and the received column address COL_ADDR to the column address latch 250. In addition, the address register 220 may provide the bank address BANK_ADDR and the row address ROW_ADDR to the row hammer management circuit 500 and the RMW driver 600.

The bank control logic 230 may generate bank control signals in response to the bank address BANK_ADDR. For example, among the plurality of row decoders 260_1 to **260_*n*, a row decoder corresponding to the bank address BANK_ADDR may be activated in response to the bank control signals. Among the plurality of column decoders 270_1 to 270_*n***, a column decoder corresponding to the bank address BANK_ADDR may be activated in response to the bank control signals.

The row address multiplexer 240 may receive a row address ROW_ADDR from the address register 220 and a refresh row address REF_ADDR from the refresh control circuit 400. The row address multiplexer 240 may selectively output the row address ROW_ADDR or the refresh row address REF_ADDR as a row address RA. The row address RA, output from the row address multiplexer 240, may be applied to each of the plurality of row decoders 260_1 to **260_*n***.

The refresh control circuit 400 may sequentially increase or decrease the refresh row address REF_ADDR in normal refresh mode in response to refresh signals from the control logic circuit 210.

The refresh control circuit 400 may receive a hammer address HADDR in hammer refresh mode. The refresh control circuit 400 may output addresses of wordlines, adjacent to intensively accessed wordlines, as refresh row addresses REF_ADDR based on the hammer address HADDR.

Among the plurality of row decoders 260_1 to **260_*n*, a row decoder selected by the bank control logic 230A may activate a wordline corresponding to a row address RA output from the row address multiplexer 240**. For example, the selected row decoder may apply a wordline driving voltage to a wordline corresponding to the row address.

The column address latch 250 may receive the column address COL_ADDR from the address register 220 and temporarily store the received column address COL_ADDR. For example, in burst mode, the column address latch 250 may incrementally increase the received column address COL_ADDR. The column address latch 250 may apply the temporarily stored or incrementally increased column address COL_ADDR' to each of the plurality of column decoders 270_1 to **270_*n***.

Among the plurality of column decoders 270_1 to **270_*n*, a column decoder activated by the bank control logic 230 may activate a sense amplifier corresponding to the bank address BANK_ADDR and column address COL_ADDR through the input/output gating circuit 290**.

The input/output gating circuit 290 may include circuits inputting/outputting data. The input/output gating circuit 290 may include data latches, storing codewords output from the plurality of bank arrays 310_1 to **310_*n*, and write drivers writing data in the plurality of bank arrays 310_1 to 310_*n***.

In some implementations, during a read operation, a codeword CW read from a selected bank array among the plurality of bank arrays 310_1 to **310_*n* may be detected by a sense amplifier corresponding to the selected bank array and may be stored in the data latches of the input/output gating circuit 290. The codeword CW stored in the data latches may be ECC-decoded by the ECC engine 350 and provided to the data input/output buffer 320 as data DTA. The data input/output buffer 320 may generate a data signal DQ based on the data DTA and provide the data signal DQ to the memory controller 100** along with a strobe signal DQS.

In some implementations, during a write operation, the data DTA to be written in a selected bank array among the plurality of bank arrays 310_1 to **310_*n* may be received by the data input/output buffer 320 as a data signal DQ. The data input/output buffer 320 may convert the data signal DQ into the data DTA and provide the data DTA to the ECC engine 350. The ECC engine 350 may generate parity bits (or parity data) based on the data DTA and provide a codeword CW, including the data DTA and the parity bits, to the input/output gating circuit 290. The input/output gating circuit 290** may write the codeword CW to the selected bank array.

The data input/output buffer 320 may convert the data signal DQ into data DTA and provide the data DTA to the ECC engine 350 during a write operation. The data input/output buffer 320 may convert the data DTA, provided from the ECC engine 350, into a data signal DQ during a read operation.

The ECC engine 350 may perform ECC encoding on the data DTA during a write operation. The ECC engine 350 may perform ECC decoding on the codeword CW during a read operation. In addition, the ECC engine 350 may perform ECC encoding and ECC decoding on count data CNTD provided from the row hammer management circuit 500.

The control logic circuit 210 may control the operation of the memory device 200. For example, the control logic circuit 210 may generate control signals to control the memory device 200 to perform a write operation, a read operation, a normal refresh operation, and a hammer refresh operation. The control logic circuit 210 may include a command decoder 211, decoding a command CMD received from the memory controller 100, and a mode register set (MRS) 212 setting operation mode of the memory device 200.

The command decoder 211 may decode the command CMD to generate internal command signals such as an internal active signal IACT, an internal precharge signal IPRE, an internal read signal IRD, and an internal write signal IWR. The command decoder 211 may decode a chip select signal and a command/address signal to generate control signals corresponding to the command CMD.

Figure 3:
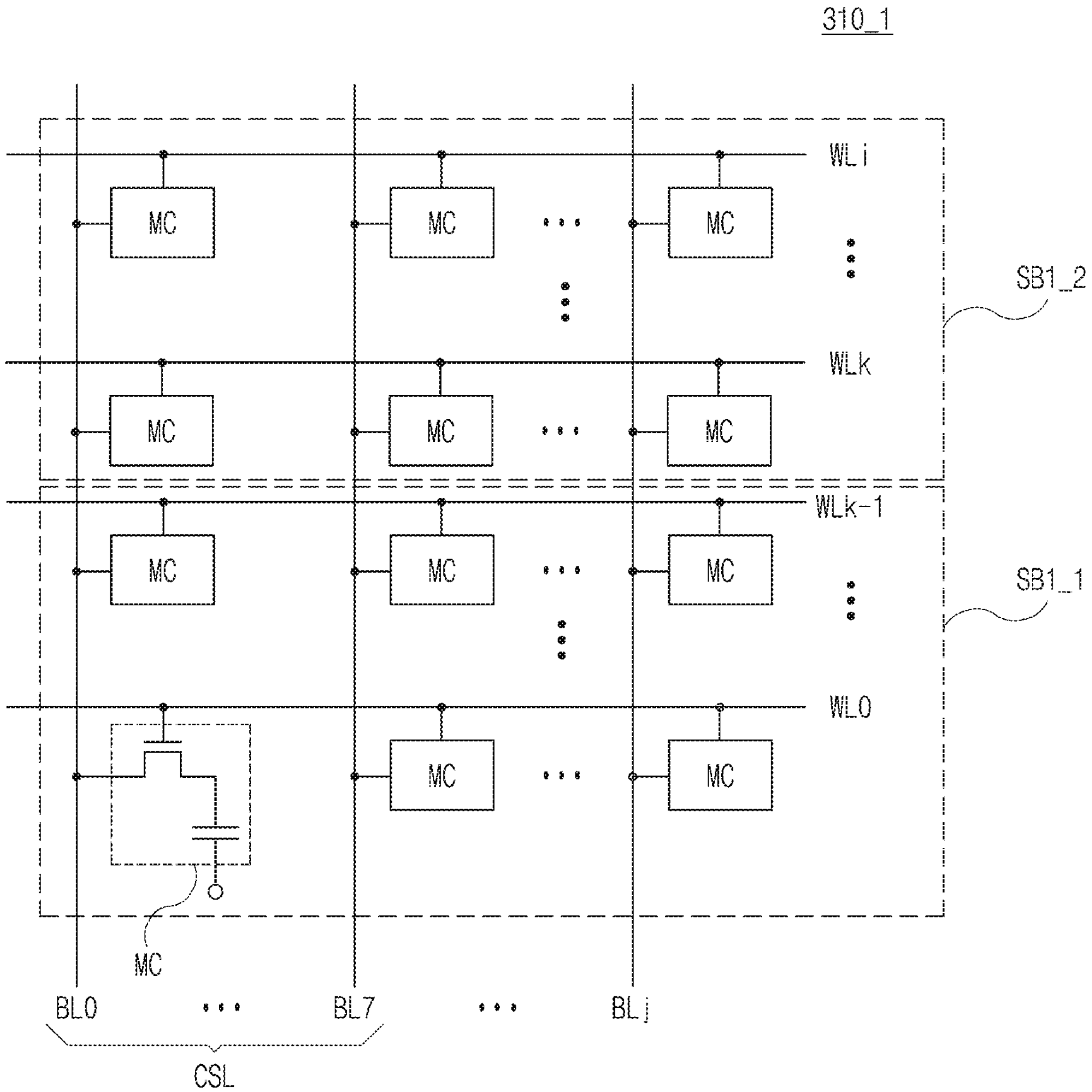
FIG. 3 is a diagram illustrating an example of a bank array according to some implementations.

FIG. 3 is a diagram illustrating an example of a bank array according to some implementations. A bank array 310_1 of FIG. 3 may correspond to, for example, the first bank array 310_1 of FIG. 2. For ease of description, in FIG. 3, an example is provided in which the first bank array 310_1 includes two sub-banks SB1_1 and SB1_2 disposed in a bitline direction. In addition, an example is provided in which a single column select line CSL corresponds to eight bitlines.

In FIG. 3, the first bank array 310_1 may include a plurality of wordlines WL0 to WLi, a plurality of bitlines BL0 to BLj, and a plurality of memory cells MC disposed at the intersections of the wordlines WL0 to WLi and bitlines BL0 to BLj.

In some implementations, each memory cell MC may be a DRAM cell. For example, each memory cell MC may include a cell transistor, connected to a wordline and a bitline, and a cell capacitor connected to the cell transistor.

A single column select line CSL may be electrically connected to a plurality of bitlines. For example, a single column select line CSL may be electrically connected to 8 bitlines. In some implementations, 8 bits of data may be read from or written in memory cells MC through a single wordline and a single column select line CSL.

In some implementations, the first bank array 310_1 may include a 1_1-th sub-bank SB1_1 and a 1_2-th sub-bank SB1_2. For example, memory cells connected to 0th to k−1-th wordlines WL0 to WLk−1 may constitute a 1_1-th sub-bank SB1_1, and memory cells connected to kth to ith WLk to WLi may constitute a 1_2-th sub-bank SB1_2. In an example embodiment, the 1_1-th sub-bank SB1_1 and the 1_2-th sub-bank SB1_2 may correspond to different banks. For example, sub-banks constituting a single bank array may correspond to different banks, respectively.

Figure 4:
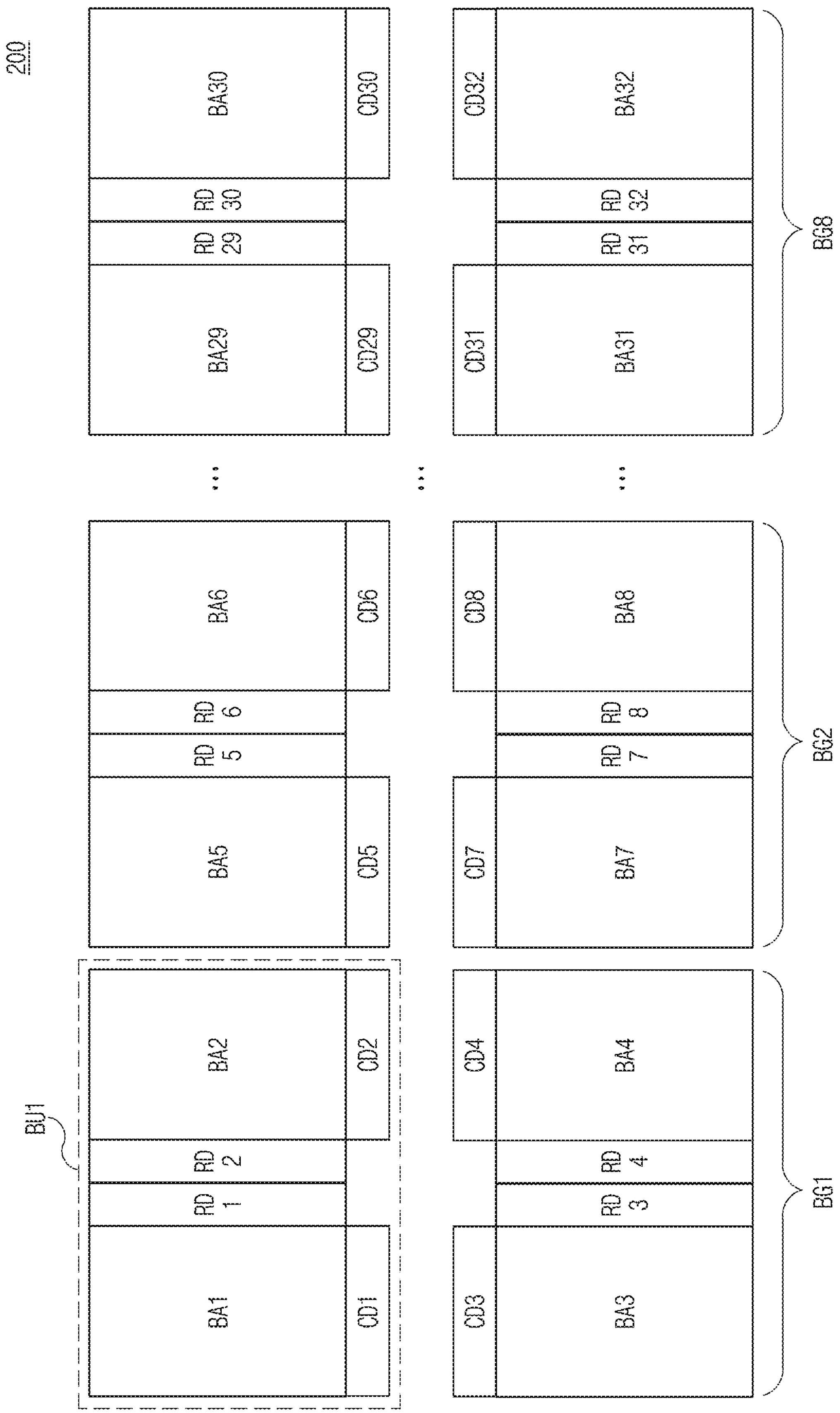
FIG. 4 is a diagram illustrating an example of a memory device according to some implementations.

FIG. 4 is a diagram illustrating an example of a memory device according to some implementations. FIG. 4 illustrates an example of the arrangement of bank arrays and corresponding row decoders and column decoders. The memory device 200 of FIG. 4 may correspond to, for example, the memory device 200 of FIGS. 1 and 3. For ease of description, an example is provided in which the memory device 200 includes 32 bank arrays and a single bank group BG includes 4 bank arrays.

In FIG. 4, a first bank group BG1 may include first to fourth bank arrays BA1 to BA4. For example, the first and second bank arrays BA1 and BA2 may be disposed adjacent to each other on an upper portion of a substrate, not illustrated, and the third and fourth bank arrays BA3 and BA4 may be disposed adjacent to each other on a lower portion of the substrate.

A first row decoder RD1 and a first column decoder CD1 may correspond to the first bank array BA1, and a second row decoder RD2 and a second column decoder CD2 may correspond to the second bank array BA2. In addition, a third row decoder RD3 and a third column decoder CD3 may correspond to the third bank array BA3, and a fourth row decoder RD4 and a fourth column decoder CD4 may correspond to the fourth bank array BA4.

Bank arrays, row decoders, and column decoders, disposed adjacent to each other, may be referred to as a bank unit. For example, a first bank array BA1, a second bank array BA2, first and second row decoders RD1 and RD2, and first and second column decoders CD1 and CD2 may be referred to as a first bank unit BU1.

The first and second row decoders RD1 and RD2 may be disposed between the first and second bank arrays BA1 and BA2 adjacent to each other. In addition, the third and fourth row decoders RD3 and RD4 may be disposed between the third and fourth bank arrays BA3 and BA4 adjacent to each other. However, this is only an example, and the bank arrays, the row decoders, and the column decoders may be disposed in various ways according to some implementations.

Similarly, a second bank group BG2 may include fifth to eighth bank arrays BA5 to BA8. Fifth and sixth row decoders RD5 and RD6 may be disposed between the fifth and sixth bank arrays BA5 and 6 BA6 adjacent to each other, and seventh and eighth row decoders RD7 and RD8 may be disposed between the seventh and eighth bank arrays BA7 and BA8 adjacent to each other. Similarly, an eighth bank group BG8 may include $29^{th}$ to $32^{nd}$ bank arrays BA29 to BA32, and row decoders may be disposed between bank arrays adjacent to each other.

Figure 5:
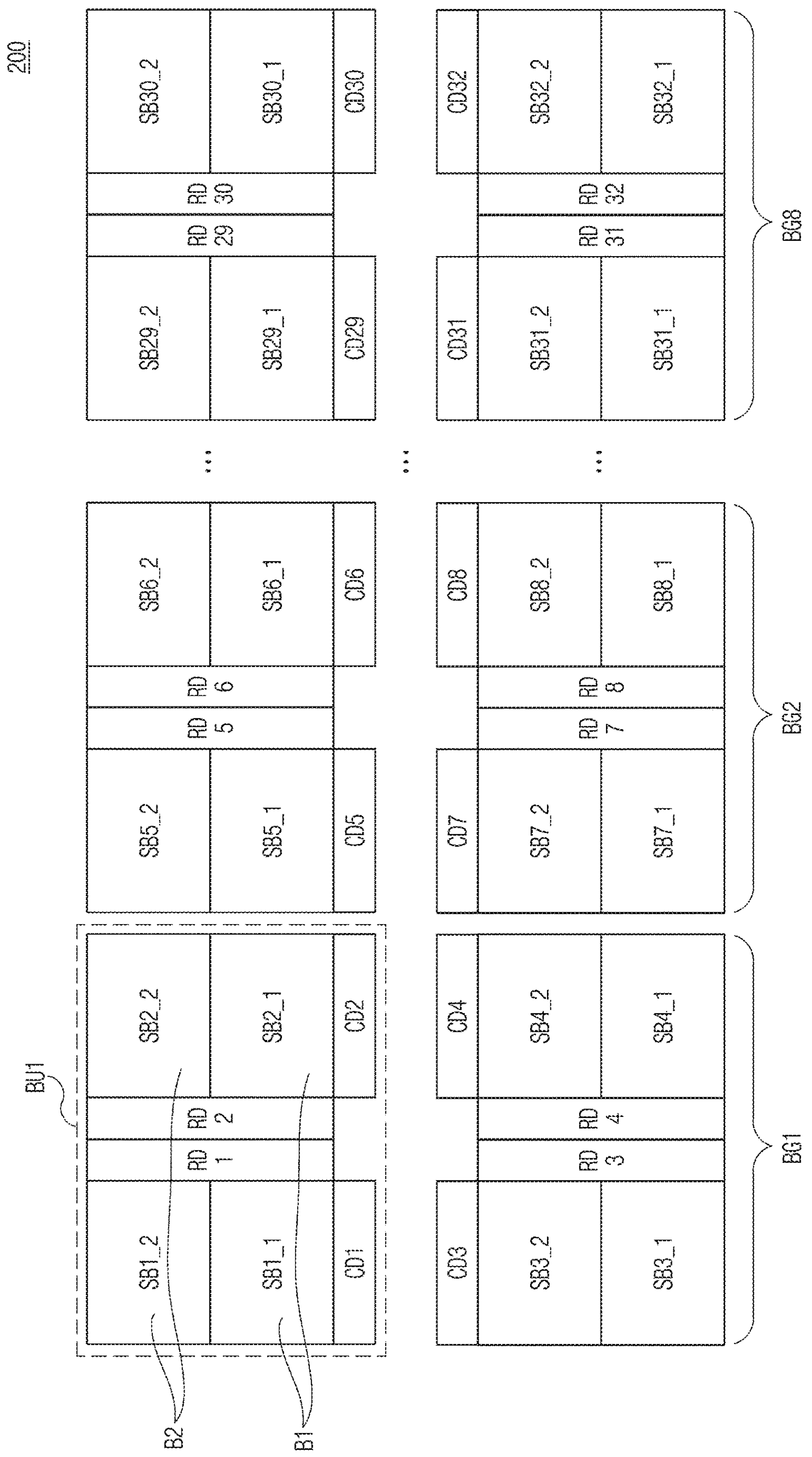
FIG. 5 is a diagram illustrating an example of a bank defined in the memory device of FIG. 4 according to some implementations.

FIG. 5 is a diagram illustrating an example of a bank defined in the memory device 200 of FIG. 4 according to some implementations. For ease of description, an example is provided in which a single bank array includes two sub-banks.

In FIGS. 4 and 5, each bank array may include two sub-banks. For example, the first bank array BA1 may include a 1_1-th sub-bank SB1_1 and a 1_2-th sub-bank SB1_2, and the second bank array BA2 may include a 2_1-th sub-bank SB2_1 and a 2_2-th sub-bank SB2_2.

A bank may be defined using two sub-banks disposed adjacent to each other in a wordline direction. For example, the first bank B1 may be defined to include a 1_1-th sub-bank SB1_1 and a 2_1-th sub-bank SB2_1, and the second bank B2 may be defined to include a 1_2-th sub-bank SB1_2 and a 2_2-th sub-bank SB2_2.

In some implementations, two sub-banks included in a single bank may independently operate. For example, the 1_1-th sub-bank SB1_1 of the first bank B1 may be connected to the first row decoder RD1 and the first column decoder CD1, and may independently perform read and write operations. In addition, the 2_1-th sub-bank SB2_1 of the first bank B1 may be connected to the second row decoder RD2 and the second column decoder CD2, and may independently perform read and write operations.

For example, the 1_2-th sub-bank SB1_2 of the second bank B2 may be connected to the first row decoder RD1 and the first column decoder CD1, and may independently perform read and write operations. In addition, the 2_2-th sub-bank SB2_2 of the second bank B2 may be connected to the second row decoder RD2 and the second column decoder CD2, and may independently perform read and write operations.

As described above, a bank may be defined to include sub-banks adjacent to each other in the wordline direction. Accordingly, two different read or write operations may be performed independently in a single bank.

Figure 6A:
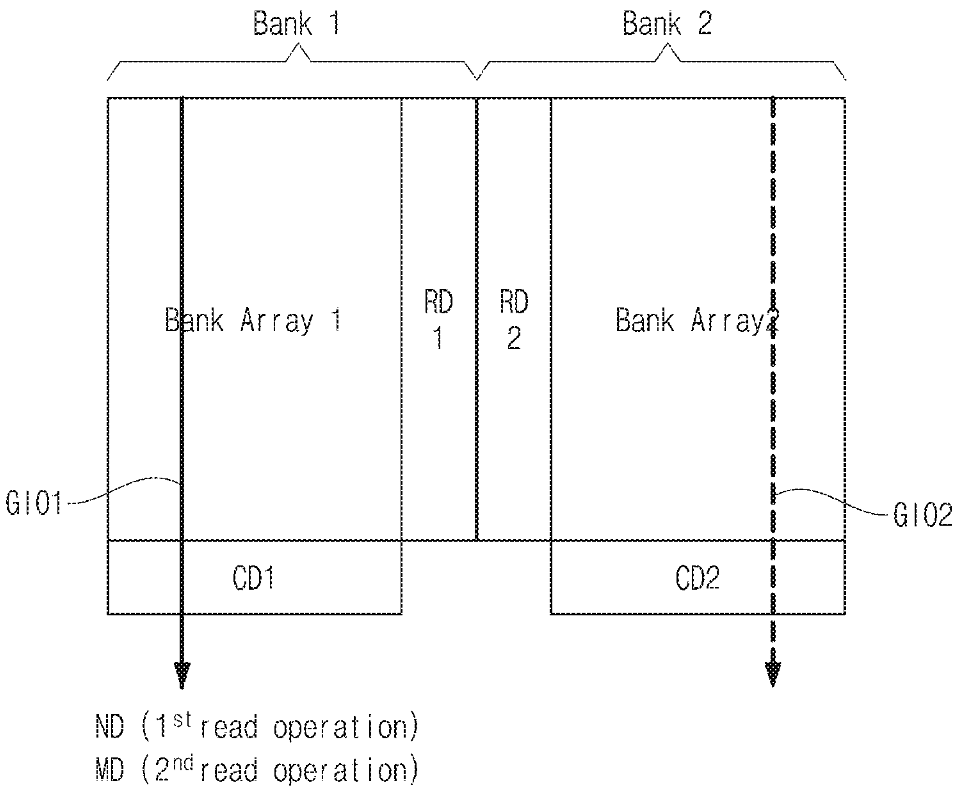
FIGS. 6A to 6C are diagrams illustrating examples of an operation of a bank in a memory device according to some implementations.
Figure 6B:
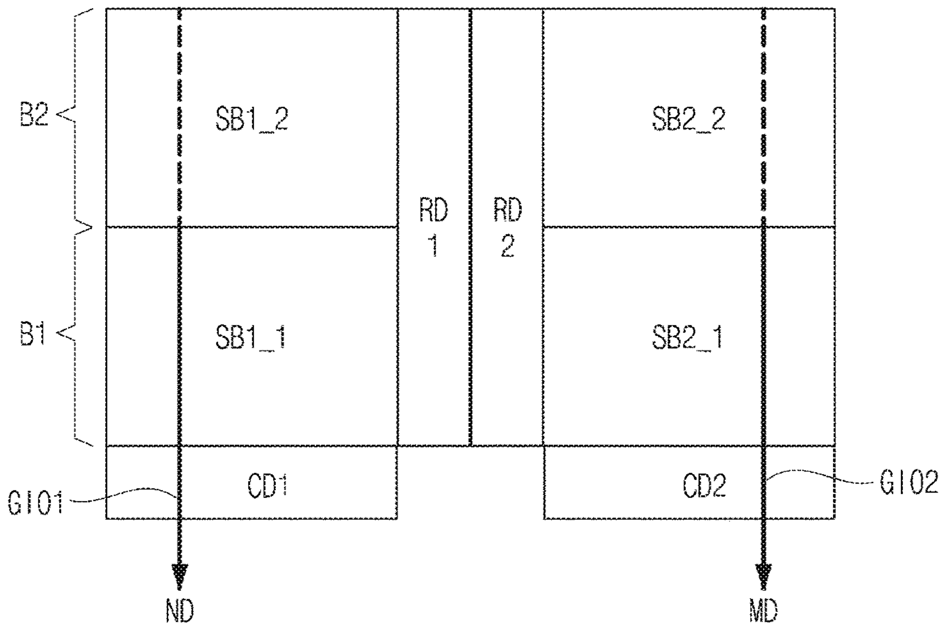
Figure 6C:
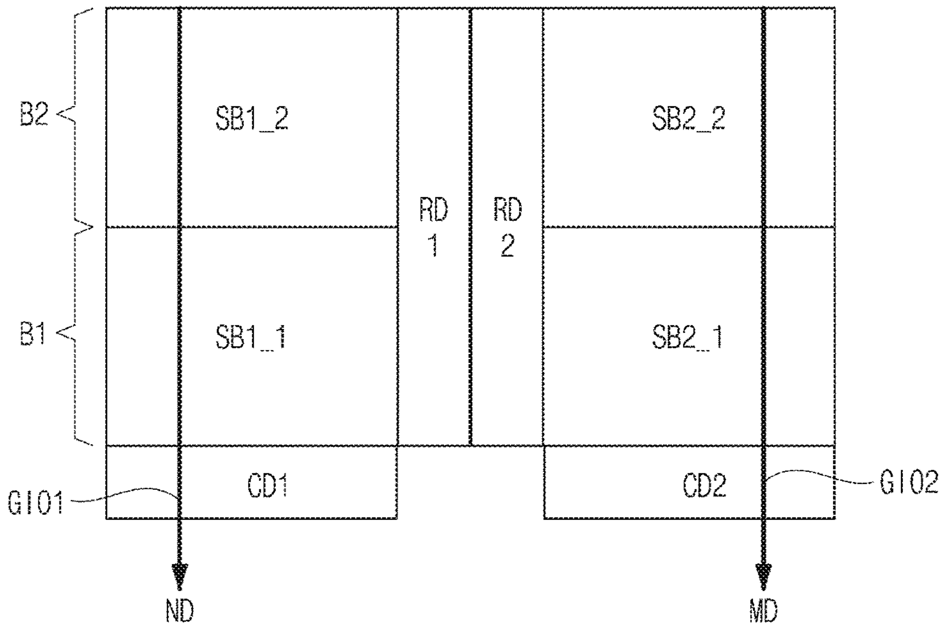

FIGS. 6A to 6C are diagrams illustrating an example of an operation of a bank of a memory device according to some implementations. For example, FIG. 6A illustrates an example of a read operation in a memory device in which a single bank corresponds to a single bank array. FIGS. 6B and 6C illustrates an example of a read operation in the memory device 200 of FIG. 5, in which a single bank includes two sub-banks.

In FIG. 6A, in general, a bank is defined to include a single bank array. For example, as illustrated in FIG. 6A, a first bank is defined to include a first bank array, a first row decoder, and a first column decoder, and a second bank may be defined to include a second bank array, a second row decoder, and a second column decoder.

When a read operation is performed on normal data ND stored in the first bank array and corresponding metadata MD, a first read operation of reading the normal data ND and a second read operation of reading the metadata MD may be sequentially performed.

In some implementations, both the normal data ND and the metadata MD may be output to the outside through a first global I/O line GIO1. Accordingly, after the first read operation is performed, the first global I/O line GIO1 should be precharged to perform the second read operation. As a result, a large amount of time is required to read the normal data ND and the corresponding metadata MD in a general memory device.

In FIG. 6B, according to an example embodiment, a first bank B1 may be defined to include a 1_1-th sub-bank SB1_1 and a 2_1-th sub-bank SB2_1. In some implementations, normal data ND may be stored in the 1_1-th sub-bank SB1_1, and corresponding metadata MD may be stored in the 2_1-th sub-bank SB2_1.

Since the 1_1-th sub-bank SB1_1 is connected to the first row decoder RD1 and the first column decoder CD1, the read operation on the normal data ND stored in the 1_1-th sub-bank SB1_1 may be independently performed. Also, since the 2_1-th sub-bank SB2_1 is connected to the second row decoder RD2 and the second column decoder CD2, the read operation on the metadata MD stored in the 2_1-th sub-bank SB2_1 may be independently performed.

In addition, since the 1_1-th sub-bank SB1_1 corresponds to the first global I/O line GIO1 and the 2_1-th sub-bank SB2_1 corresponds to the second global I/O line GIO2, the normal data ND and the metadata MD may be output to the outside through the first global I/O line GIO1 and the second global I/O line GIO2, respectively. Accordingly, there is no need to precharge the global I/O line between the read operation on the normal data ND and the read operation on the metadata MD.

As a result, the normal data ND and the metadata MD stored in the first bank B1 may be simultaneously output.

In some implementations, even when the normal data ND and the metadata MD are stored in the second bank B2, the normal data ND and the metadata MD may be simultaneously output.

For example, as illustrated in FIG. 6C, the normal data ND and the metadata MD may be stored in the 1_2-th sub-bank SB1_2 and the 2_2-th sub-bank SB2_2, respectively. In some implementations, the normal data ND and the metadata MD may be simultaneously output through the first global I/O line GIO1 and the second global I/O line GIO2, respectively.

In FIGS. 6B and 6C, an example of read operations on the normal data ND and the metadata MD has been described. However, it should be understood that this is only an example and some implementations are not limited thereto. According to some implementations, even when normal data ND and metadata MD are stored in the first bank B1 or the second bank B2, a write operation on the normal data ND and a write operation on the metadata MD may be simultaneously performed.

Figure 7:
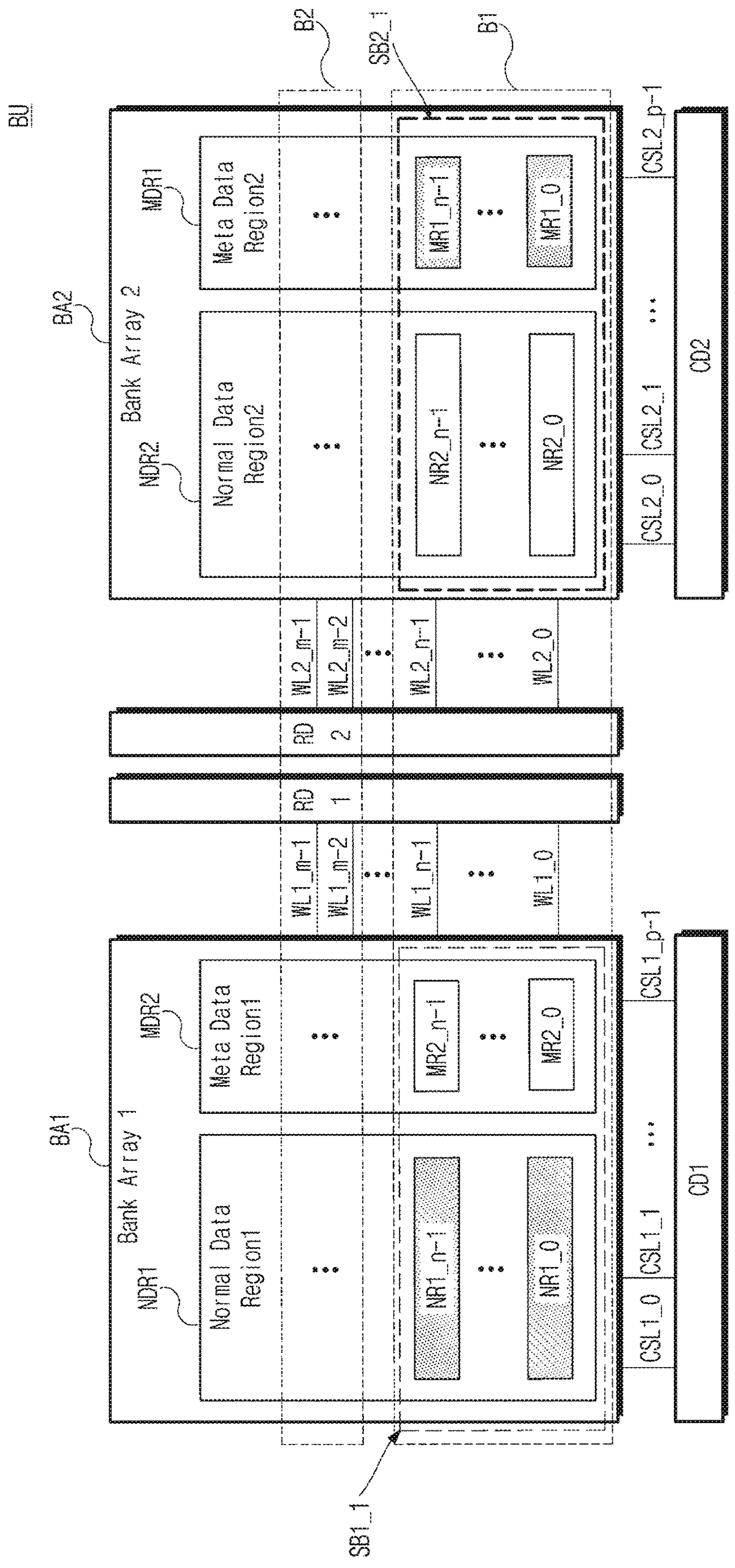
FIG. 7 is a block diagram illustrating an example of a bank unit according to some implementations.

FIG. 7 is a block diagram illustrating an example of a bank unit according to some implementations. A bank unit BU of FIG. 7 may correspond to, for example, one of the bank units BU of FIGS. 4 and 5.

In FIG. 7, a bank unit BU may include first and second bank arrays BA1 and BA2, first and second row decoders RD1 and RD2, and first and second column decoders CD1 and CD2.

The first bank array BA1 may be connected to the first row decoder RD1 through a plurality of first wordlines WL1_0 to WL1_*m*−1, and may be connected to the first column decoder CD1 through a plurality of first column select lines CSL1_0 to CSL1_*p*−1.

The second bank array BA2 may be connected to the first row decoder RD1 through a plurality of second wordlines WL2_0 to WL2_*m*−1 and may be connected to the first column decoder CD1 through a plurality of column select lines CSL2_0 to CSL2_*p*−1.

The first bank B1 may include a 1_1-th sub-bank SB1_1, included in the first bank array BA1, and a 2_1-th sub-bank SB2_1 included in the second bank array BA2.

The 1_1-th sub-bank SB1_1 may be connected to the first row decoder RD1 through first wordlines WL1_0 to WL1_*n*−1 and may be connected to the first column decoder CD1 through first column select lines CSL1_0 to CSL1_*p*−1. The 2_1-th sub-bank SB2_1 may be connected to the second row decoder RD2 through second wordlines WL2_0 to WL2_*n*−1 and may be connected to the second column decoder CD2 through second column select lines CSL2_0 to CSL2_*p*−1. In some implementations, n is 32k (where k is 1024) and p is 64. However, this is only an example, and may vary depending on memory capacity or required specification.

In FIG. 7, the first normal region NDR1 may include a plurality of normal regions 1 NR1_0 to NR1_*n*−1, respectively corresponding to the first wordlines WL1_0 to WL1_*n*−1. The first meta region MDR1 may include a plurality of meta regions 1 MR1_0 to MR1_*n*−1, respectively corresponding to the second wordlines WL2_0 to WL2_*n*−1.

Metadata for normal data stored in one of the normal regions 1 NR1_0 to NR1_*n*−1 may be stored in a first meta region corresponding to one of the first metal regions 1 MR1_0 to MR1_*n*−1. For example, there may be a corresponding relationship between each of the plurality of meta regions 1 MR2_0 to MR2_*n*−1 and each of the plurality of first normal regions NDR1.

In some implementations, each of the first meta regions MR1_0 to MR1_*n*−1 may be disposed symmetrically with respect to corresponding each of the first normal region NR1_0 to NR1_*n*−1, based on the first row decoder RD1.

For example, metadata for normal data stored in the 1_0-th normal region NR1_0 may be stored in a region connected to the 2_0-th wordline WL2_0 corresponding to the 1_0-th wordline WL1_0, for example, the 1_0-th metal region MR1_0. Similarly, metadata for normal data stored in the 1_n−1-th normal region NR1_*n*−1 may be stored in the 1_n−1-th meta region MR1_*n*−1.

According to some implementations, write and read operations on the second wordlines WL2_0 to WL2_*n*−1 for first metadata may be performed in the same order as write and read operations on the first wordlines WL1_0 to WL1_*n*−1 for corresponding normal data. For example, the write and read operations on first normal data and corresponding first metadata may be sequentially performed together in a direction in which indices of the first and second wordlines increase (or decrease). In some implementations, coding of wordlines may be simplified.

In some implementations, when a read or write operation on normal data and corresponding metadata is requested, both of two wordlines forming a wordline pair may be activated.

For example, when a read operation is requested for normal data stored in the 1_0-th normal region NR1_0 and metadata stored in the corresponding the 1_0-th metal region MR1_0, the first row decoder RD1 may activate the 1_0-th wordline WL1_0 and the second row decoder RD2 may activate the 2_0-th wordline WL2_0. Then, the normal data stored in the 1_0-th normal region NR1_0 corresponding to 1_0-th wordline WL1_0 may be output, and the metadata stored in the 1_0-th metal region MR1_0 corresponding to 2_0-th wordline WL2_0 may be output.

In some implementations, metadata for normal data stored in one sub-bank may be stored in a plurality of wordlines corresponding to another sub-bank. In addition, when a read or write operation is requested for normal data and corresponding metadata, two wordlines forming a wordline pair may be activated together. As a result, wordline coding on the sub-banks may be simplified.

Figure 8:
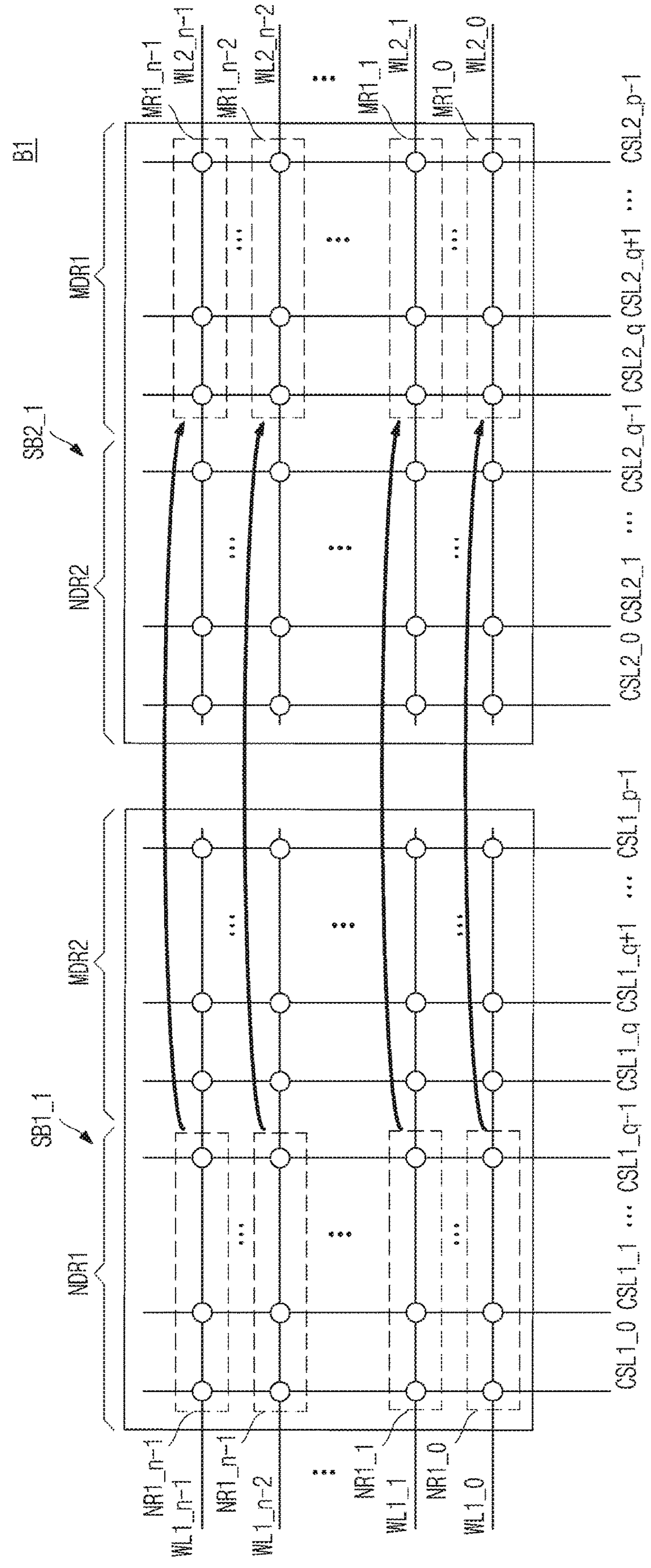
FIG. 8 is a schematic diagram illustrating an example of an assignment of a column select line to metadata within each sub-bank according to some implementations.

FIG. 8 is a schematic diagram illustrating an example of an assignment of a column select line to metadata within each sub-bank according to some implementations. A bank B1 of FIG. 8 may correspond to the first bank of FIG. 1 or FIG. 7. Accordingly, the same or similar components are denoted by the same or similar reference numerals, and duplicate descriptions will be omitted below.

In some implementations, column select lines connected to a single sub-bank may be divided into and assigned to a normal data storage region and a metadata storage region for normal data in another sub-bank of the same bank.

In FIG. 8, among p first column select lines CSL1_0 to CSL1_p−1 connected to a 1_1-th sub-bank SB1_1, q first column select lines CSL1_0 to CSL1_p−1 may be assigned to a first normal region NDR1, and r first column select lines CSL1_q to CSL1_p−1 may be assigned to a second meta region MDR2.

Similarly, among p second column select lines CSL2_0 to CSL2_p−1 connected to a 2_1-th sub-bank SB2_1, q second column select lines CSL1_0 to CSL1_q−1 may be assigned to a second normal region NDR2, and r second column select lines CSL2_q to CSL2_p−1 may be assigned to a first meta region MDR1. Hereinafter, the column select lines assigned to the first normal region and the second normal region may be referred to as normal column select lines, and column select lines assigned to the first meta region and the second meta region may be referred to as meta column select lines.

A ratio of normal column select lines and meta column select lines, among column select lines connected to a single sub-bank, may be determined based on a ratio of normal data and metadata.

In some implementations, when a ratio of normal data and metadata is k:1, k normal column select lines of one sub-bank may correspond to a single meta column select line of another sub-bank in the same bank in the order of indices column select lines.

For example, first normal column select lines CSL1_0 to CSL1_k−1 may correspond to a second meta column select line CSL2_q, and first normal column select lines CSL1_k to CSL1_2k−1 may correspond to a second meta column select line CSL2_q+1. Similarly, first normal column select lines CSL1_q−k to CSL1_q−1 may each correspond to a second meta column select line CSL2_q+r−1. However, some implementations are not limited thereto and may vary depending on the design of the memory device. For example, as long as the ratio of normal column select lines and meta column select lines is determined based on the ratio of normal data and metadata, the former and the latter may not be the same. In some implementations, when the ratio of normal data and metadata is k:1, k−1 normal column select lines of one sub-bank may correspond to a single meta column select line of another sub-bank in the same bank, in the order of indices of column select lines.

In some implementations, a storage location of metadata of the second sub-bank may correspond to a first wordline and a first normal column select line connected to memory cells in which corresponding normal data of the first sub-bank is stored. For example, metadata for normal data stored in memory cells connected to the first normal column select lines CSL1_0 to CSL1_k−1 in a 1_0-th normal region NR1_0 may be stored in a location corresponding to a 2_0-th wordline WL2_0 corresponding to a 1_0-th wordline WL1_0 and a second meta column select line CLS2_q corresponding to 1_0-th to 1_k−1-th column select lines CSL1_0 to CSL1_k−1.

In FIGS. 7 and 8, when a read operation is requested for normal data stored in the 1_0-th normal region NR1_0 and corresponding metadata stored in the 1_0-th metal region MR1_0, the first row decoder RD1 may activate the 1_0-th wordline WL1_0 and the second row decoder RD2 may activate the 2_0-th wordline WL2_0. When the first column decoder CD1 activates one of the 1_0-th to 1_k−1-th normal column select lines CSL1_0 to CSL1_k−1 in the state in which the wordlines are activated, the second column decoder CD2 may activate second meta column select line CLS2_q. Through such an operation, while reading normal data corresponding to the 1_0-th to 1_k−1-th normal column select lines CSL1_0 to CSL1_k−1 from the normal data stored in the 1_0-th normal region NR1_0, metadata assigned to second meta column select line CLS2_q, among the metadata stored in the 1_0-th metal region MR1_0, may be read.

As described above, normal data may be accessed by activating the first wordline and the first normal column select line connected to a region in which target normal data is stored, and target metadata may be accessed by activating the second wordline corresponding to the first wordline and the second meta column select line corresponding to the first normal column select line.

In some implementations, column select lines connected to one sub-bank may be divided into and assigned to a normal data storage region and a metadata storage region for normal data in another sub-bank of the same bank. Accordingly, a chip size for assignment of the metadata may be prevented from additionally increasing, and efficient assignment of the metadata may be implemented.

With respect to the first bank, the bank B1 is divided into the 1_1-th sub-bank SB1_1 and the second sub-bank SB_2_, but may operate functionally in the same manner as a bank structure in which a bank is not divided into sub-banks. For example, the 1_1-th sub-bank SB1_1 is internally connected to a plurality of first wordlines WL1_0 to WL1_n−1, and the 2_1-th sub-bank SB2_1 is internally connected to a plurality of second wordlines WL2_0 to WL2_n−1. However, when n is 32k, the first bank B1 may operate in the same manner as a single bank connected to a total of 62k (where k is 1024) wordlines (for example, WL_0 to WL_62k−1). The plurality of first wordlines WL1_0 to WL1_32k−1 and the plurality of second wordlines WL2_0 to WL2_32k−1 may correspond to $0^{th}$ to 32k-th wordlines WL0 to WL32k−1 and 32k+1-th to 62k-th wordlines WL32k+1 to WL62k−1, among a total of 62k wordlines (for example, WL_0 to WL_62k−1), respectively. Accordingly, the 1_1-th sub-bank SB1_1 connected to the plurality of first wordlines WL1_0 to WL1_32k−1 and the 2_1-th sub-bank SB2_1 connected to the plurality of second wordlines WL2_0 to WL2_32k−1 in the above embodiments may correspond to a portion, connected to 32k wordlines (for example, WL0 to WL32k−1), and a portion, connected to 32k wordlines (for example, WL32 to WL62k−1), in a bank having no sub-bank structure, respectively.

Figure 9:
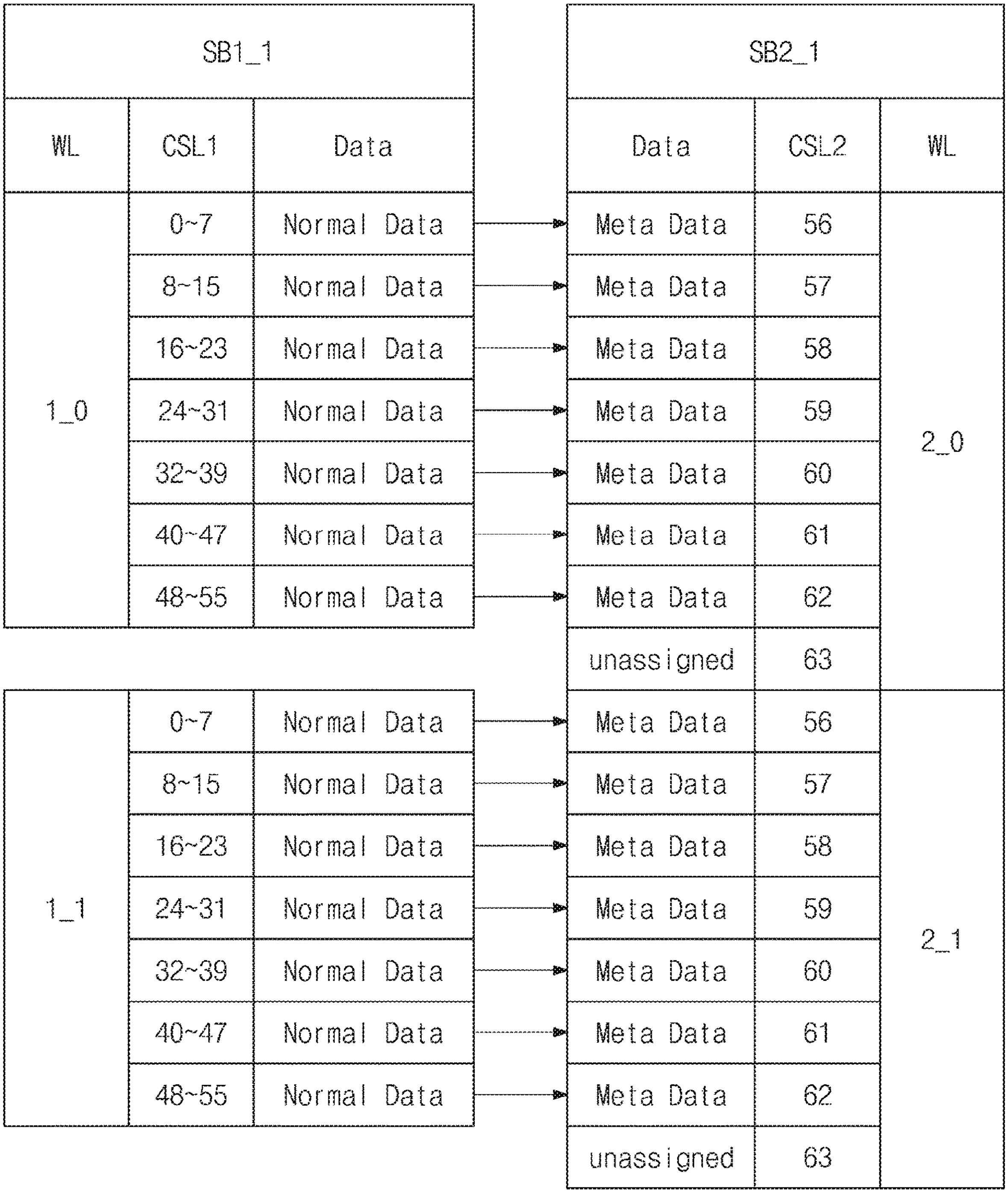
FIG. 9 is a diagram illustrating an example of an assignment of wordlines and column select lines in sub-banks within the same bank according to some implementations.

FIG. 9 is a diagram illustrating an example of an assignment of wordlines and column select lines in sub-banks within the same bank according to some implementations. The following description will be provided based on the case in which normal data is stored in a 1_1-th sub-bank SB1_1 and corresponding metadata is stored in a 2_1-th sub-bank SB2_1. However, some implementations may be equally applied to even the case in which normal data is stored in the 2_1-th sub-bank SB2_1 and corresponding metadata is stored in the 1_1-th sub-bank SB1_1.

FIG. 9 illustrates the case in which a ratio of normal data and metadata is 8:1 and the number of column select lines is 64. In some implementations, the ratio of column select lines assigned for actual normal data and column select lines assigned for metadata may be 7:1. This is to satisfy a required ratio of 7:1 without additional chip size overhead.

Normal data may be stored in memory cells corresponding to a 1_0-th wordline WL1_0 and 1_0-th to 1_7-th column select lines CSL1_0 to CSL1_7, and metadata corresponding to the normal data may be stored in memory cells corresponding to a 2_0-th wordline WL2_0 and a 2_56-th column select line CSL2_56.

Normal data is stored in memory cells corresponding to the 1_0-th wordline WL1_0 and the first column select lines_8 to 1_15 CSL1_8 to CSL1_15, and metadata corresponding to the normal data may be stored in memory cells corresponding to the 2_0-th wordline WL2_0 and a 2_57-th column select line CSL2_57.

Similarly, normal data may be stored in memory cells corresponding to the 1_0-th wordline WL1_0 and 1_48-th to 1_55-th column select lines CSL1_48 to CSL1_55, and metadata corresponding to the normal data may be stored in memory cells corresponding to the 2_0-th wordline WL2_0 and a 2_62-th column select line CSL2_62.

Data may not be stored in memory cells corresponding to the 2_0-th wordline WL2_0 and a 2_63-th column select line CSL2_63.

In a similar manner, normal data may be stored in memory cells corresponding to a 1_1-th wordline WL1_1 and 1_0-th to 1_7-th column select lines CSL1_0 to CSL1_7, and metadata corresponding to the normal data may be stored in memory cells corresponding to a 2_1-th wordline WL2_1 and a 2_56-th column select line CSL2_56. Similarly, normal data may be stored in memory cells corresponding to the 1_1-th wordline WL1_1 and 1_48-th to 1_55-th column select line CSL1_48 to CSL1_55, and metadata corresponding to the normal data may be stored in memory cells corresponding to the 2_1-th wordline WL2_1 and the 2_62-th column select line CSL2_62.

FIG. 10 is a diagram illustrating an example of an assignment of wordlines and column select lines in sub-banks within the same bank according to some implementations. FIG. 10 illustrates the case in which a ratio of normal data and metadata is 16:1 and the number of column select lines is 64. In some implementations, a ratio of column select lines assigned for actual normal data and column select lines assigned for metadata may be 15:1. This is to satisfy a required ratio of 15:1 without additional chip size overhead.

Normal data may be stored in memory cells corresponding to a 1_0-th wordline WL1_0 and 1_0-th to 1_14-th column select lines CSL1_0 to CSL1_14. Metadata corresponding to the normal data may be stored in memory cells corresponding to a 2_0-th wordline WL2_0 and a 2_60-th column select line CSL2_60.

Normal data may be stored in memory cells corresponding to the 1_0-th wordline WL1_0 and 1_15-th to 1_29-th column select lines CSL1_15 to CSL1_29. Metadata corresponding to the normal data may be stored in memory cells corresponding to the 2_0-th wordline WL2_0 and a 2_61-th column select line CSL2_61.

Similarly, normal data may be stored in memory cells corresponding to the 1_0-th wordline WL1_0 and 1_45-th to 1_59-th column select lines CSL1_45 to CSL1_59, and metadata corresponding to the normal data may be stored in memory cells corresponding to the 2_0-th wordline WL2_0 and a 2_63-th column select line CSL2_63.

The above description has been provided based on the case in which normal data is stored in the 1_1-th sub-bank SB1_1 and corresponding metadata is stored in the 2_1-th sub-bank SB2_1. However, the above assignment method may be equally applied to even the case in which normal data is stored in the 2_1-th sub-bank SB2_1 and corresponding metadata is stored in the 1_1-th sub-bank SB1_1.

Figure 11:
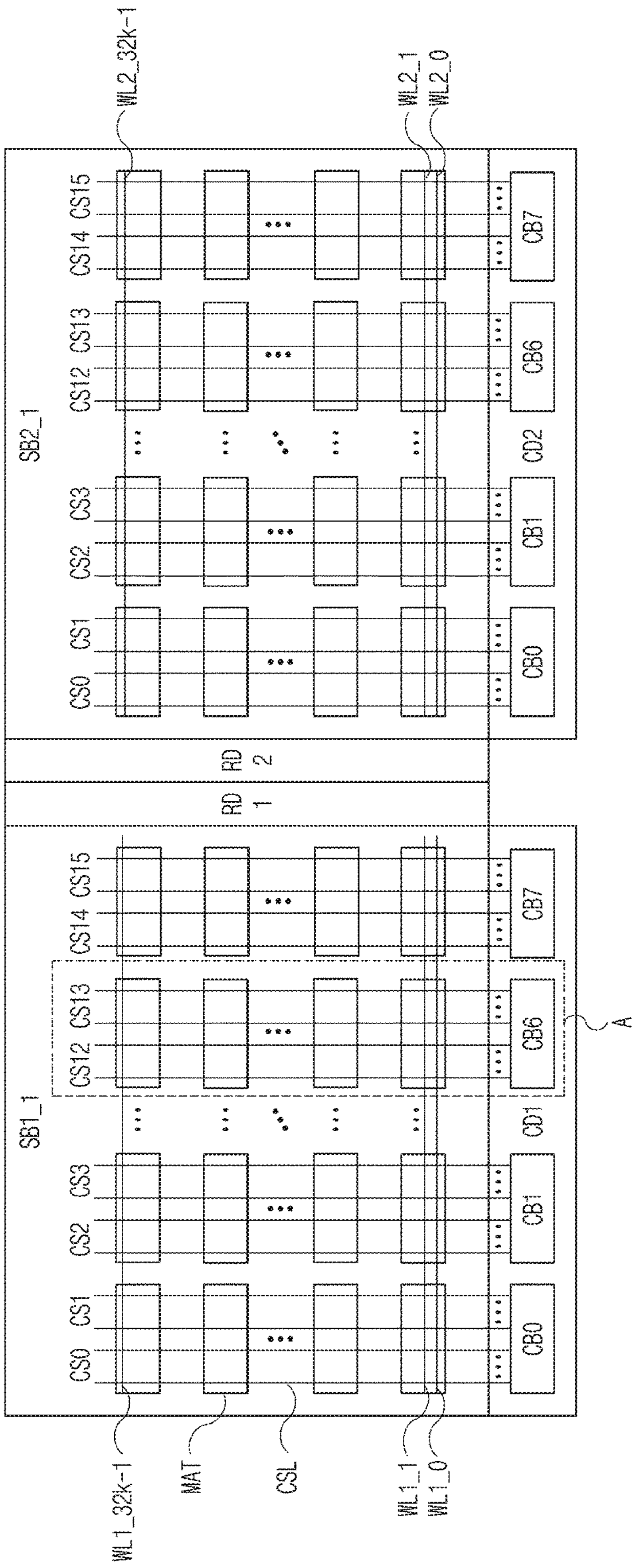
FIG. 11 is a diagram illustrating an example of a bank according to some implementations.
Figure 12:
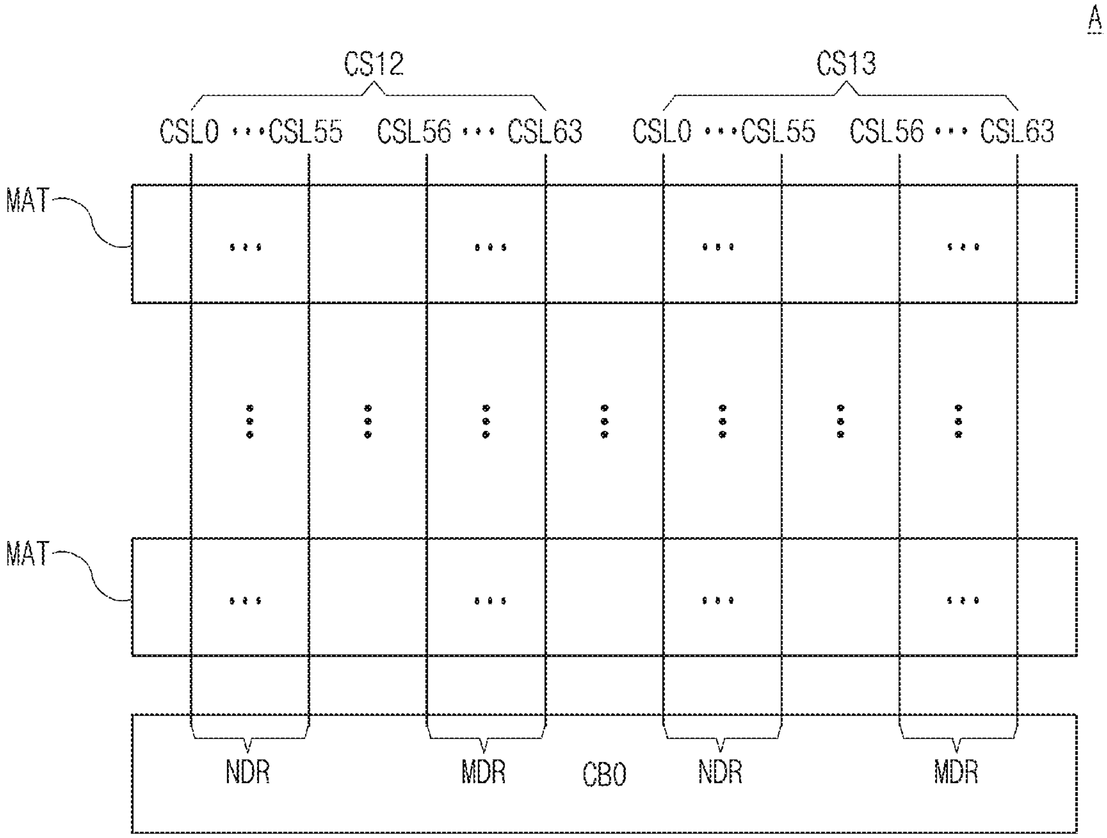
FIG. 12 is a diagram illustrating an example of area "A" of FIG. 11 according to some implementations.

FIG. 11 is a diagram illustrating an example of a bank according to some implementations, and FIG. 12 is a diagram illustrating an example of area "A" of FIG. 11 according to some implementations. A first bank B1 of FIG. 11 may correspond to one of the first banks B1 described in FIGS. 1 to 8.

A 1_1-th sub-bank SB1_1 may be electrically connected to a first row decoder RD1 and a first column decoder CD1. The 1_1-th sub-bank SB1_1 may be connected to a plurality of wordlines WL1_0 to WL1_32$k$−1 through the first row decoder RD1. In addition, the 1_1-th sub-bank SB1_1 may be connected to a plurality of column select lines CSL through the first column decoder CD1.

A 2_1-th sub-bank SB2_1 may be electrically connected to a second row decoder RD2 and a second column decoder CD2. The 2_1-th sub-bank SB2_1 may be connected to a plurality of wordlines WL2_0 to WL2_32$k$−1 through the second row decoder RD2. In addition, the 2_1-th sub-bank SB2_1 may be connected to a plurality of column select lines CSL through the second column decoder CD2.

Each of the 1_1-th sub-bank SB1_1 and the 2_1-th sub-bank SB2_1 may include a plurality of mats MATs. Each of the plurality of mats MATs may be connected to a portion of wordlines and a portion of column select lines CSLs. Each of the plurality of mats MATs may include a plurality of memory cells, and each of the plurality of memory cells may be connected to a single wordline, among a portion of wordlines connected to a corresponding mat MAT, and a single column select lines CSL, among a portion of column select lines connected to the corresponding mat MAT.

The first column decoder CD1 may include a plurality of CSL blocks CB0 to CB7. Each of the plurality of CSL blocks CB0 to CB7 may be configured to select a column select line to be activated from among a plurality of column select lines, based on a column select signal from the first column decoder CD1. Similarly, the second column decoder CD2 may include a plurality of CSL blocks CB0 to CB7. Each of the plurality of CSL blocks CB0 to CB7 may be configured to select a column select line to be activated from among a plurality of column select lines, based on a decoded column address from the second column decoder CD2. In FIG. 11, the number of CSL blocks in each sub-bank is illustrated as being 8, but some implementations are not limited thereto. In addition, each sub-bank may further include an error correction code (ECC) block. In some implementations, mats MATs connected to a column corresponding to the ECC block may store parity bits generated by the ECC block.

In some implementations, each CSL block CB may correspond to two CSL groups CS. For example, a 0th CSL block CB0 may correspond to 0th and first CSL groups CS0 and CS1, and a first CSL block CB1 may correspond to second and third CSL groups CS2 and CS3. Similarly, a sixth CSL block CB6 may correspond to twelfth and thirteenth CSL groups CS12 and CS13, and a seventh CSL block CB7 may correspond to fourteenth and fifteenth CSL groups CS14 and CS15.

Each CSL group CS may include a plurality of column select lines. For example, each CSL group CS may include 64 column select lines, and a portion of the 64 column select lines may be assigned to a normal data region, and another portion of the 64 column select lines may be assigned to a metadata region.

A more detailed description will now be provided with respect to a sixth CSL block CB6 illustrated in FIG. 12. The sixth CSL block CB6 may be connected to the twelfth CSL group CS12 and the thirteenth CSL group CS13. The twelfth CSL group CS12 may include 0th to 63rd column select lines CSL0 to CSL63, and the thirteenth CSL group CS13 may include 0th to 63rd column select lines CSL0 to CSL63. Accordingly, a total of 128 column select lines may be connected to the sixth CSL block CB6.

When an example is provided in which a ratio of normal data and metadata is 8:1, the 0th to 55th column select lines CSL0 to CSL55 in the twelfth CSL group CS12 may be assigned to the normal data region NDR, and the remaining 56th to 63rd column select lines CSL56 to CSL63 may be assigned to the metadata area MDR. The 0th to 55th column select lines CSL0 to CSL55 in the thirteen CSL group CS13 may be assigned to the normal data region NDR, and the remaining 56th to 63rd column select lines CSL56 to CSL63 may be assigned to the metadata region MDR. As described above, a portion of the column select lines in each CSL group CS may be assigned to the normal data region NRD, and another portion thereof may be assigned to the metadata region MDR.

In FIG. 11, during one access operation, a single column select line in a single CSL group CS may be selected and activated. Two CSL groups CS correspond to the single CSL block CB, so that one or two column select lines may be selected by the single CSL block CB during one access operation.

For ease of description, an example is provided in which a decoded column address is 'CSLx[a:b].' In some implementations, 'x' may refer to the number of a column select line, and '[a:b]' may refer to the range of a selected CSL group. A column select signal may include information on a column address, and may be generated through a column decoder.

In addition, an example is provided in which a column address decoded by the first column decoder CD1 is 'CSL0 [0:15].' In some implementations, 0th to fifteenth CSL groups CS0 to CS15 may be selected, and a 0th column select line CSL0 may be selected in each of the 0th to fifteenth CSL groups CS0 to CS15.

Since each CSL block CB corresponds to two CSL groups CS, each CSL block CB of the 1_1-th sub-bank SB1_1 may select two 0th column select lines CSL0. The two column select lines selected by each CSL block CB may be referred to as a 'CSL subset.'

For example, each CSL subset may be a set of column select lines corresponding to a portion of groups, among a plurality of groups corresponding to a single column select line. In some implementations, when a ratio of normal data and metadata is k:1, a single normal column select line may correspond to one of the k CSL subsets of a single meta column select line. In some implementations, when the number of CSL groups in a sub-bank is n, each of the k CSL subsets may sequentially correspond to an activated column select line in an n/k group.

For example, when a ratio of normal data and metadata ratio is 8:1 and the number of CSL groups corresponding to a single sub-bank is 16, each CSL subset may sequentially correspond to a column select line corresponding to two groups among a plurality of groups corresponding to a single column select line.

For example, when a ratio of normal data and metadata ratio is 16:1 and the number of CSL groups corresponding to a sub-bank is 16, each CSL subset may sequentially correspond to a column select line corresponding to a single group among a plurality of groups corresponding to a single column select line. However, some implementations are not limited thereto, and may vary depending on a required ratio of normal data and metadata and the design of a sub-bank.

The 0th to 55th column select lines CSL0 to CSL55 are assigned to the normal data area NDR, so that normal data may be input or output to the 1_1-th sub-bank SB1_1 when the decoded column address is CSL0[0:15].

When 8 bits correspond to one column select line, 128 bits (8× the number of activated CSLs) of normal data may be output or written in one wordline access operation. Since corresponding metadata is 16 bits, the corresponding metadata may be assigned to the 56th column select line in a portion of CSL groups, among the plurality of CSL groups.

For example, only some subsets of the 56th column select line may be selected by the second column decoder CD2. In some implementations, the column select signal may be 'CSL56[0:1].' In an example embodiment, the first and second CSL groups CS0 and CS1 may be selected, and the 56th column select line CSL56 may be selected in each of the first and second CSL groups CS0 and CS1. Since the 0th CSL block CB0 corresponds to the 0th and first CSL groups CS0 and CS1, the 0th CSL block CB0 in the 2_1-th sub-bank SB2_1 may select two column select lines CSL56.

In some implementations, the 56th to 63rd column select lines CSL56 to CSL63 are assigned to the metadata region MDR, so that metadata may be input or output to the 2_1-th sub-bank SB2_1 when the column select signal is CSL56 [0:1].

In some implementations, a plurality of wordlines WL1_0 to WL1_32$k$−1 corresponding to the 1_1-th sub-bank SB1_1 may match a plurality of wordlines WL2_0 to WL2_32$k$−1 corresponding to the 2_1-th sub-bank SB2_1 to form wordline pairs. For example, a wordline 1_0 WL1_0 and a wordline 2_0 WL2_0 may form a 0th wordline pair, and a wordline 1_1 WL1_1 and a wordline 2_1 WL2_1 may form a first wordline pair.

In some implementations, metadata corresponding to normal data stored in the 1_1-th sub-bank SB1_1 may be stored in the 2_1-th sub-bank SB2_1, and the normal data and the metadata may correspond to the same wordline pair.

For example, an example is provided in which the 1_0-th wordline WL1_0 and the 2_0-th wordline WL2_0 are selected by the first and second row decoders RD1 and RD2, and a ratio of normal data and metadata is 8:1.

In some implementations, when a column select signal generated by the first column decoder CD1 is 'CSL0[0:15],' a column select signal generated by the second column decoder CD2 may be 'CSL56[0:1].' In addition, when the column select signal generated by the first column decoder CD1 is 'CSL1[0:15],' the column select signal generated by the second column decoder CD2 may be 'CSL56[2:3].' In the same manner, the column select signal generated by the first column decoder CD1 is 'CSL54[0:15],' the column select signal column address generated by the second column decoder CD2 may be 'CSL56[12:13].' In addition, when the column select signal generated by the first column decoder CD1 is 'CSL55[0:15],' the column select signal generated by the second column decoder CD2 may be 'CSL62[14:15].' As a result, normal data corresponding to the 1_0-th wordline WL1_0 of the 1_1-th sub-bank SB1_1 may match the metadata corresponding to the 2_0-th wordline WL2_0 of the 2_1-th sub-bank SB2_1.

The above description has been provided based on the case in which normal data is stored in the 1_1-th sub-bank SB1_1 and corresponding metadata is stored in the 2_1-th sub-bank SB2_1. However, the above assignment method may also be applied to the case in which normal data is stored in the 2_1-th sub-bank SB2_1 and corresponding metadata is stored in the 1_1-th sub-bank SB1_1.

According to some implementations, some subsets of the corresponding meta column select line may be assigned for metadata to correspond to a single normal column select line. Accordingly, resources for the metadata may be assigned more efficiently.

FIGS. 13 to 20 are diagrams illustrating an example of a CSL assignment relationship in each sub-bank according to some implementations. The following description will be provided with respect to assignment between CSLs based on the case in which normal data is stored in the 1_1-th sub-bank SB1_1 and corresponding metadata is stored in the 2_1-th sub-bank SB2_1. However, the following description may also be applied to the case in which normal data is stored in the 2_1-th sub-bank SB2_1 and corresponding metadata is stored in the 1_1-th sub-bank SB1_1. The first bank B1 illustrated in FIGS. 13A, 14A, 15A, and 16-20 corresponds to the first bank B1 illustrated in FIG. 12. Accordingly, the same or similar components are denoted by the same or similar reference numerals, and redundant descriptions will be omitted below.

For ease of description, an example is provided in which a column select signal is 'CSLx[a:b].' In some implementations, 'x' may represent the number of column select line (where x is one of 0 to 63), and '[a:b]' may represent the range of a selected CSL group. Also, a column select line assigned to normal data is referred to as normal column select line, and a column select line assigned to metadata is referred to as meta column select line.

Figure 13A:
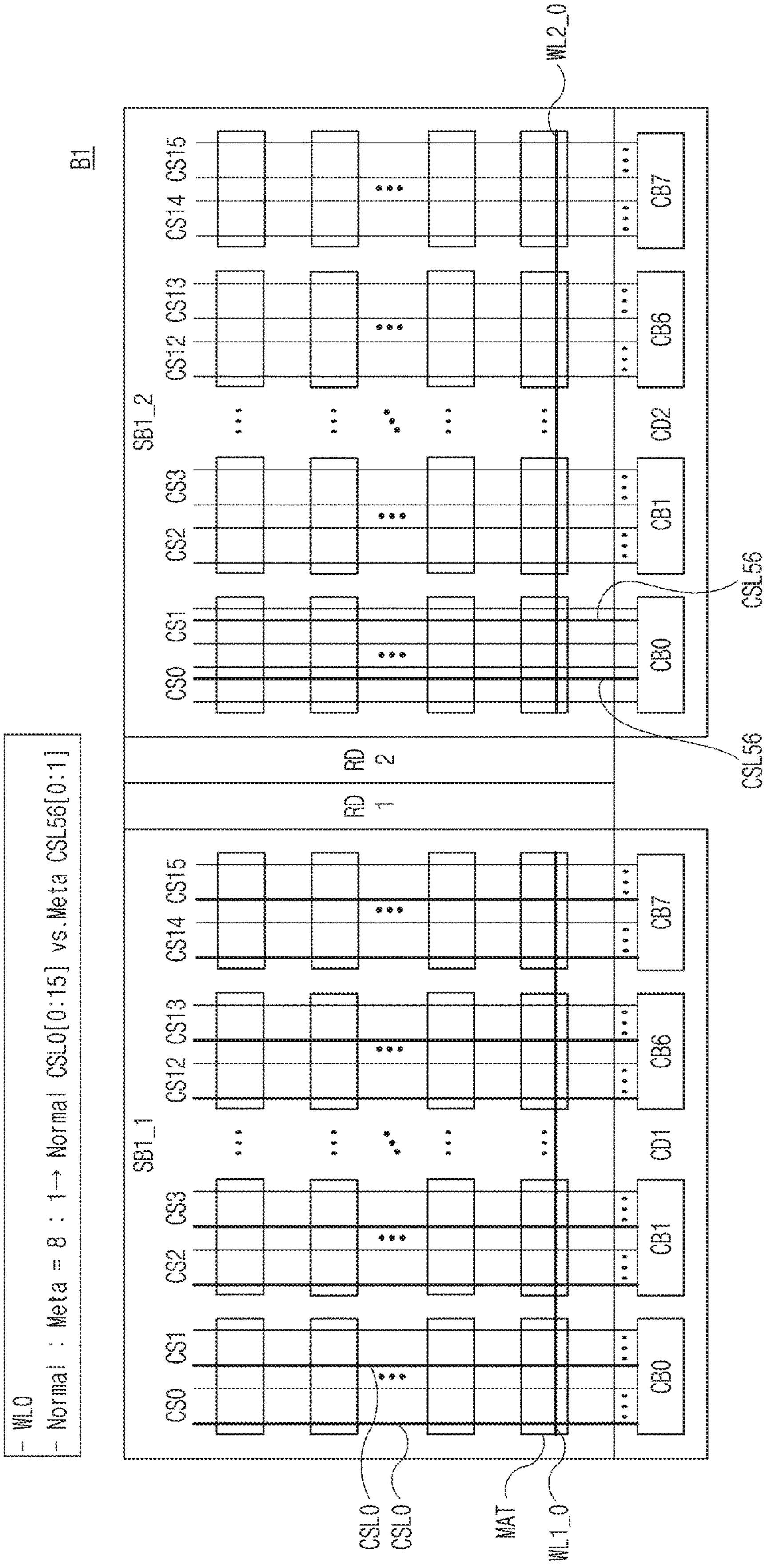
FIGS. 13A, 13B, 14A, 14B, 15A, 15B, 16A and 16B are diagrams illustrating examples of assignments of CSLs during normal data write or read operations on a single wordline according to some implementations.

In FIG. 13A, an example is provided in which a normal data write or read operation is performed on a region corresponding to the 1_0-th wordline WL1_0 and the 0th normal column select line CSL0 of the 1_1-th sub-bank_1 SB1_1.

Figure 13B:
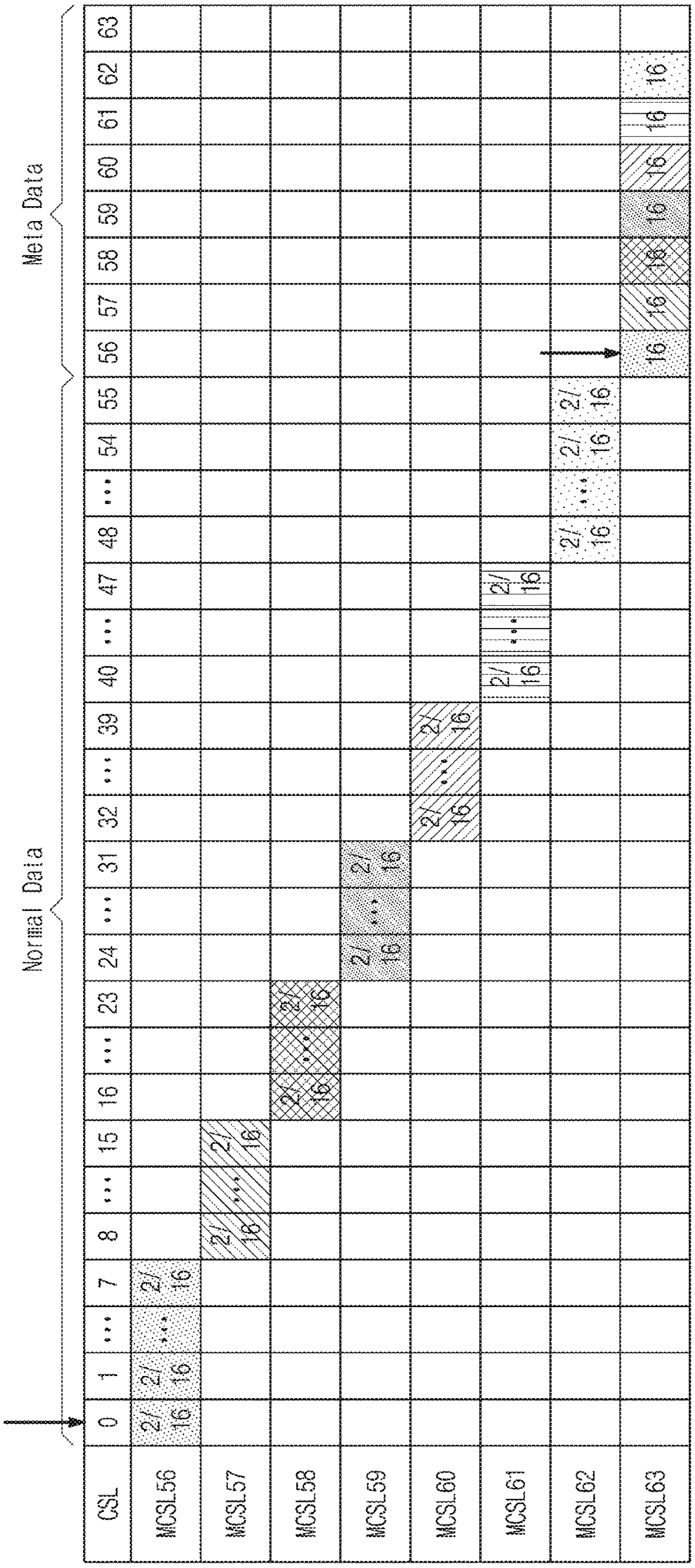

In FIG. 13B, the 0th normal column select line CSL0 may correspond to a subsets of a portion of the 56th meta column select lines CSL56.

Accordingly, metadata for the normal data may be stored in a region corresponding to the 2_0-th wordline WL2_0 corresponding to the 1_0-th wordline WL1_0 in the 2_2-th sub-bank SB2_2 and some subsets of the 56th meta column select line CSL56 corresponding to 0th normal column select line CSL0.

To this end, the row decoder 1 RD1 may activate the 1_0-th wordline WL1_0, and the second row decoder RD2 may activate the 2_0-th wordline WL2_0.

A column select signal on a side of the 1_1-th sub-bank SB1_1 may be 'CSL0[0:15].' The first column decoder CD1 may activate the 0th normal column select line CSL0 in each of the 0th to 15th CSL groups CS0 to CS15.

The second column decoder CD2 may select some subsets of the 56th meta column select line CSL56 corresponding to the 0th normal column select line CSL0. In an example embodiment, a subset corresponding to a first block (for example, CB0) may be selected. In some implementations, the column select signal may be 'CSL56[0:1].' In some implementations, the 0th and first CSL groups CS0 and CS1 may be selected, and the 56th column select line CSL56 may be selected in each of the 0th and first CSL groups CS0 and CS1. Since the 0th CSL block CB0 corresponds to the 0th and first CSL groups CS0 and CS1, the 0th CSL block CB0 of the 2_1-th sub-bank SB2_1 may activate two column select lines CSL56.

Accordingly, normal data may be written in or read from a region corresponding to the 1_0-th wordline WL1_0 and the 0th normal column select line CSL0 from the 1_1-th sub-bank SB1_1, and metadata corresponding to the normal data may be written in or read from a region corresponding to the 2_0-th wordline WL2_0 and a single subset of the 56th meta column select line CSL56 from the 2_1-th sub-bank SB2_1. Such write or read operations of normal data and metadata may be performed substantially simultaneously.

Figure 14A:
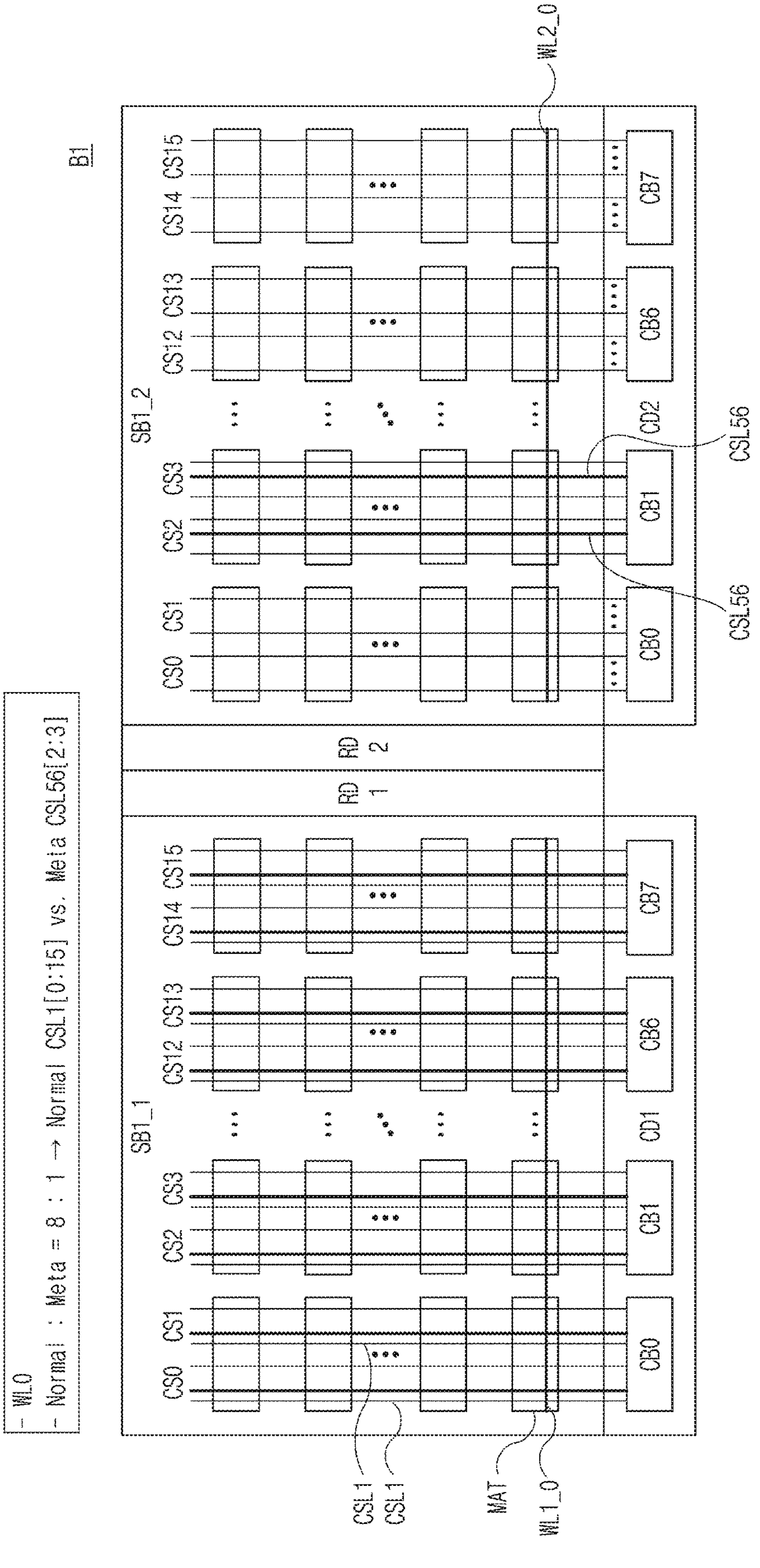

In FIG. 14A, an example is provided in which a normal data write or read operation is performed on a region corresponding to the 1_0-th wordline WL1_0 and the first normal column select line CSL1 of the 1_1-th sub-bank SB1_1.

Figure 14B:
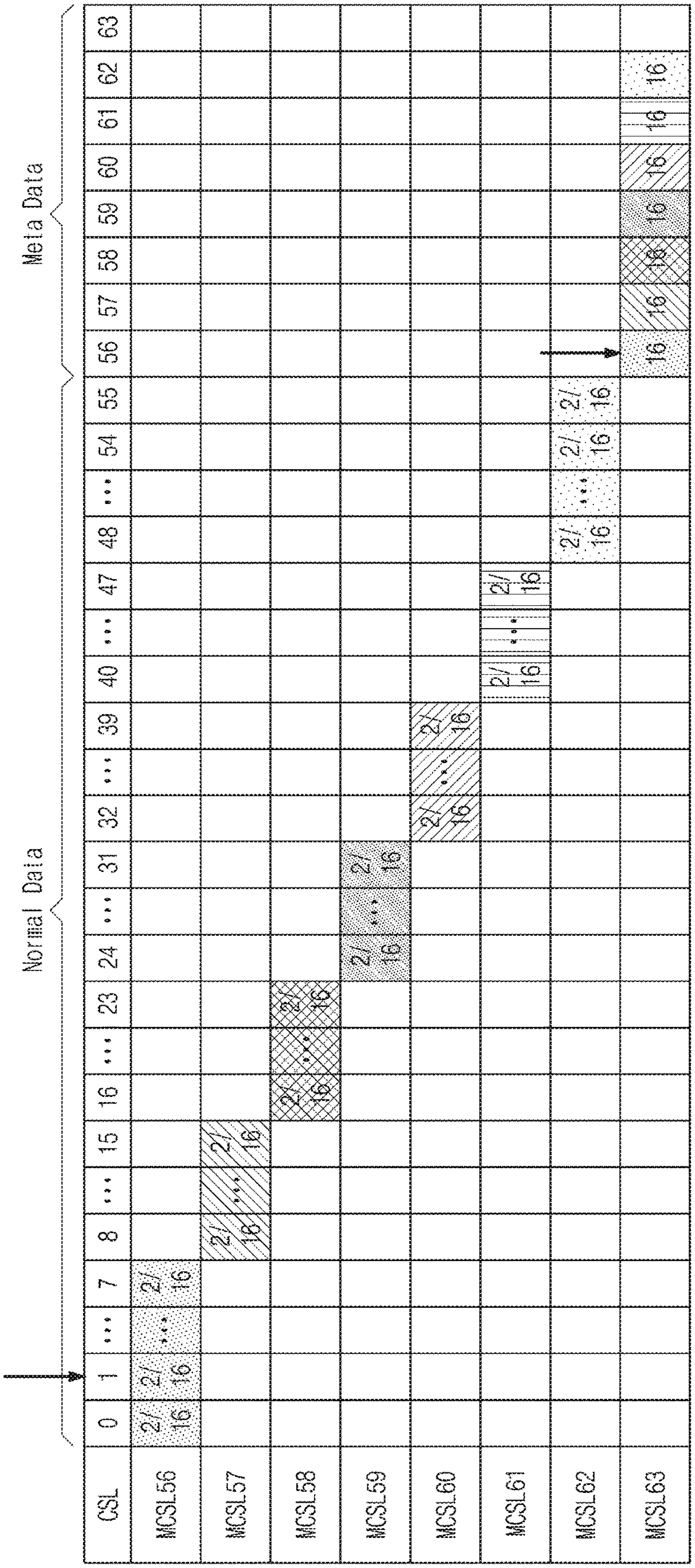

In FIG. 14B, the first normal column select line CSL1 may correspond to a subsets of a portion of the 56th meta column select lines CSL56.

Accordingly, metadata for the normal data may be stored in a region corresponding to the 2_0-th wordline WL2_0 corresponding to the 1_0-th wordline WL1_0 and some subsets of the 56th meta column select line CSL56 corresponding to the first normal column select line CSL1 within the 2_2-th sub-bank SB2_2.

To this end, the first row decoder RD1 may activate the 1_0-th wordline WL1_0, and the second row decoder RD2 may activate the 2_0-th wordline WL2_0.

A column select signal on a side of the 1_1-th sub-bank SB1_1 may be 'CSL1[0:15].' The first column decoder CD1 may activate the first normal column select line CSL1 in each of the 0th to 15th CSL groups CS0 to CS15.

The second column decoder CD2 may select some subsets of the 56th meta column select line CSL56 corresponding to the 0th normal column select line CSL0. In some implementations, a subset corresponding to the second block (for example, CB1) may be selected. In some implementations, the column select signal may be 'CSL56[2:3].' In some implementations, the second and third CSL groups CS2 and CS3 may be selected, and the 56th column select line CSL56 may be selected in each of the second and third CSL groups CS2 and CS3. Since the first CSL block CB1 corresponds to the second and third CSL groups CS0 and CS1, the first CSL block CB1 of the 2_1-th sub-bank SB2_1 may activate two 56th column select lines CSL56.

Accordingly, the normal data may be written in or read from a region corresponding to the 1_0-th wordline WL1_0 and the first normal column select line CSL1 from the first sub-bank_1 SB1_1, and metadata corresponding to the normal data may be written in or read from a region corresponding to the 2_0-th wordline WL2_0 and another subset of the 56th meta column select line CSL56 from the 2_1-th sub-bank SB2_1. Such write or read operations of normal data and metadata may be performed substantially simultaneously.

Figure 15A:
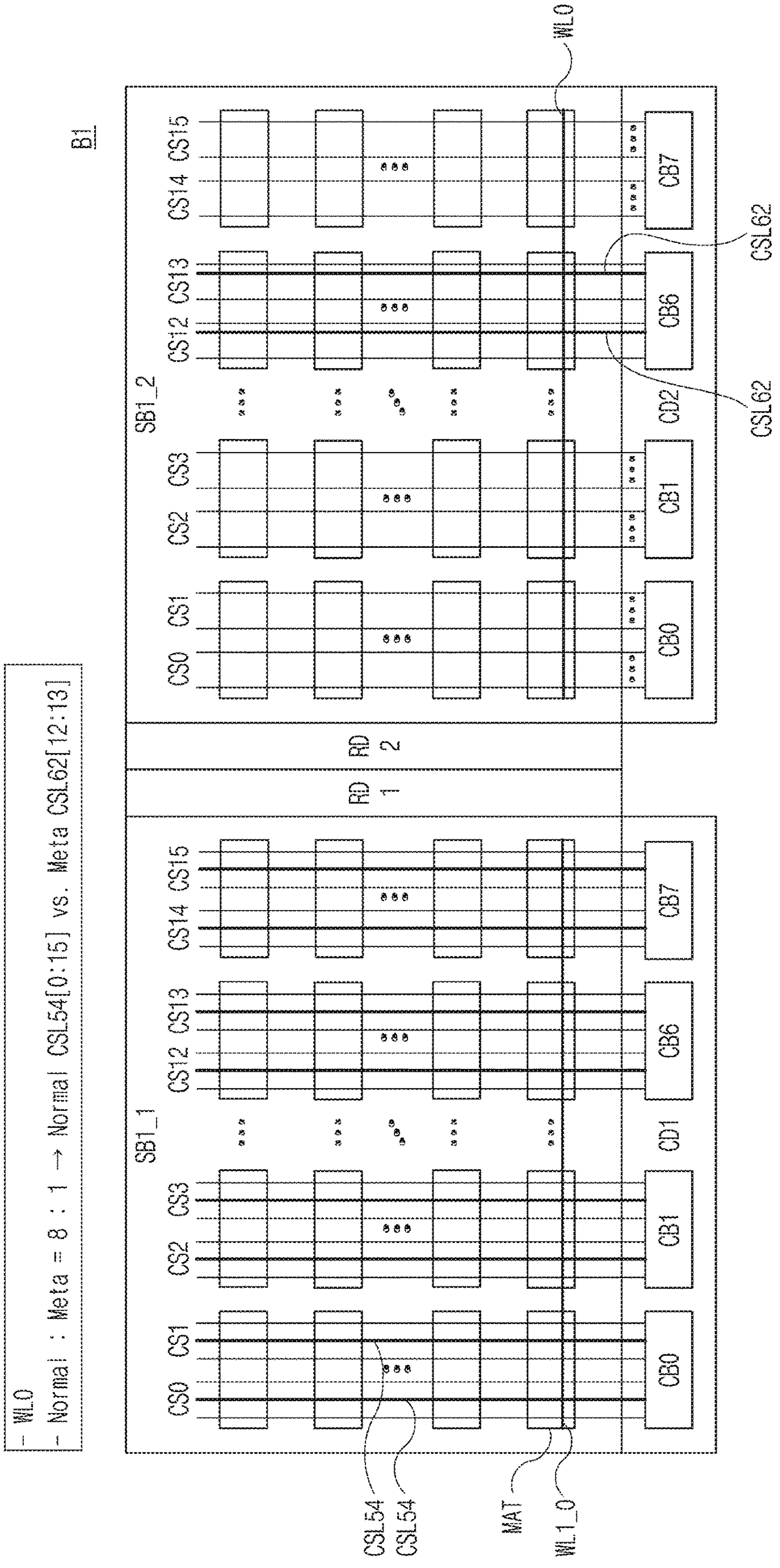

In FIG. 15A, an example is provided in which a normal data write or read operation is performed on a region corresponding to the 1_0-th wordline WL1_0 and the 54th normal column select line CSL54 of the 1_1-th sub-bank SB1_1.

Figure 15B:
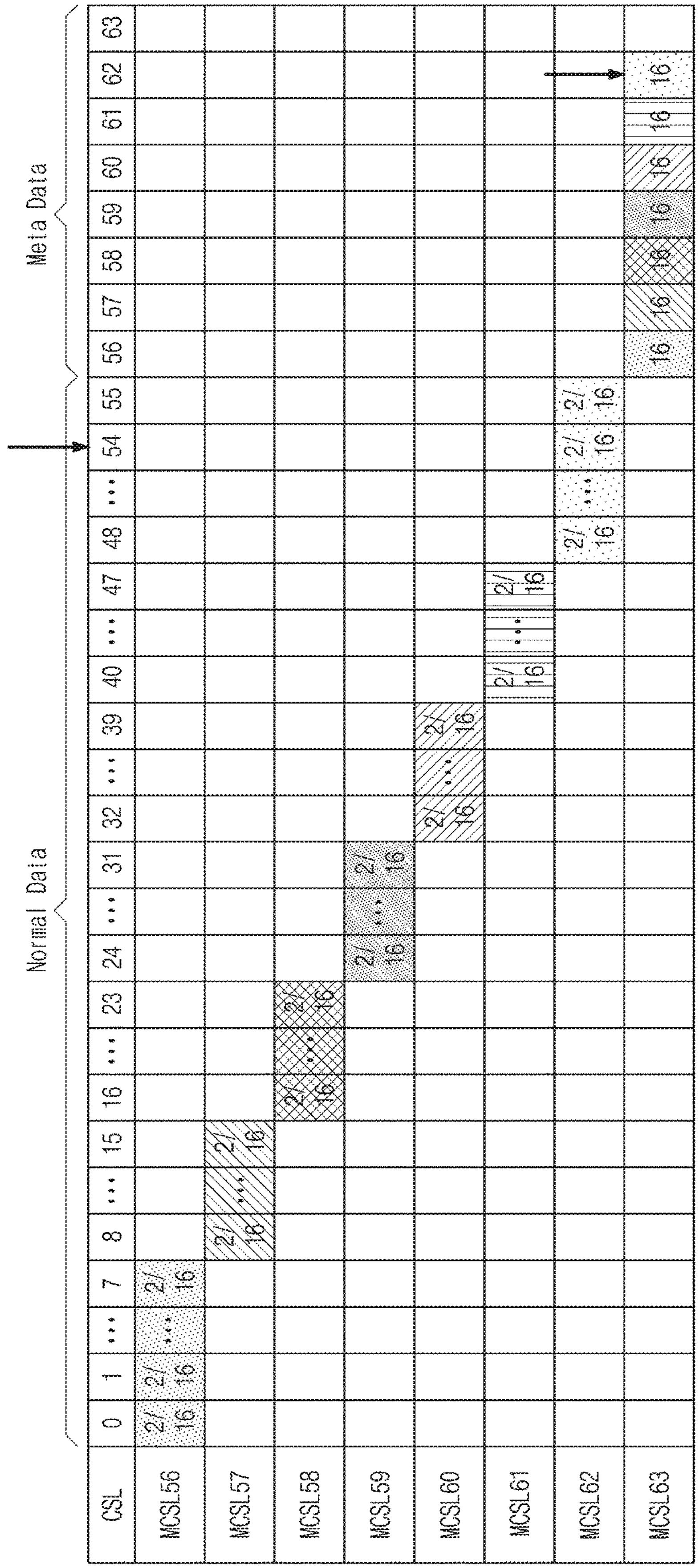

In FIG. 15B, the 54th normal column select line CSL54 may correspond to a subsets of a portion of the 62nd meta column select lines CSL62.

Accordingly, metadata for the normal data may be stored in a region corresponding to the 2_0-th wordline WL2_0 corresponding to the 1_0-th wordline WL1_0 and a subsets of a portion of the 62nd column select lines CSL62 corresponding to the 54th normal column select line CSL54 within the 2_2-th sub-bank SB2_2.

To this end, the first row decoder RD1 may activate the 1_0-th wordline WL1_0, and the second row decoder RD2 may activate the 2_0-th wordline WL2_0.

A column select signal on a side of the 1_1-th sub-bank SB1_1 may be 'CSL54[0:15].' The first column decoder CD1 may activate the 54th column select line CSL54 in each of the 0th to 15th CSL groups CS0 to CS15.

The second column decoder CD2 may select some subsets of the 62nd meta column select line CSL62 corresponding to the 54th normal column select line CSL54. In some implementations, a subset corresponding to a seventh block (for example, CB6) may be selected. In some implementations, the column select signal may be 'CSL62[12:13].' In some implementations, the twelfth and thirteenth CSL groups CS12 and CS13 may be selected, and the 62nd column select line CSL62 may be selected in each of the twelfth and thirteenth CSL groups CS12 and CS13. Since the sixth CBS block CB6 corresponds to the twelfth and thirteenth CSL groups CS12 and CS13, the sixth CSL block CB6 of the 2_1-th sub-bank SB2_1 may activate two 62nd column select lines CSL62.

Accordingly, normal data may be written in or read from a region corresponding to the 1_0-th wordline WL1_0 and the 54th normal column select line CSL54 from the 1_1-th sub-bank SB1_1, and metadata corresponding to the normal data may be written in or read from a region corresponding to the 2_0-th wordline WL2_0 and a single subset of the 62nd meta column select lines CSL62 from the 2_1-th sub-bank SB2_1. Such write or read operations of normal data and metadata may be performed substantially simultaneously.

Figure 16A:
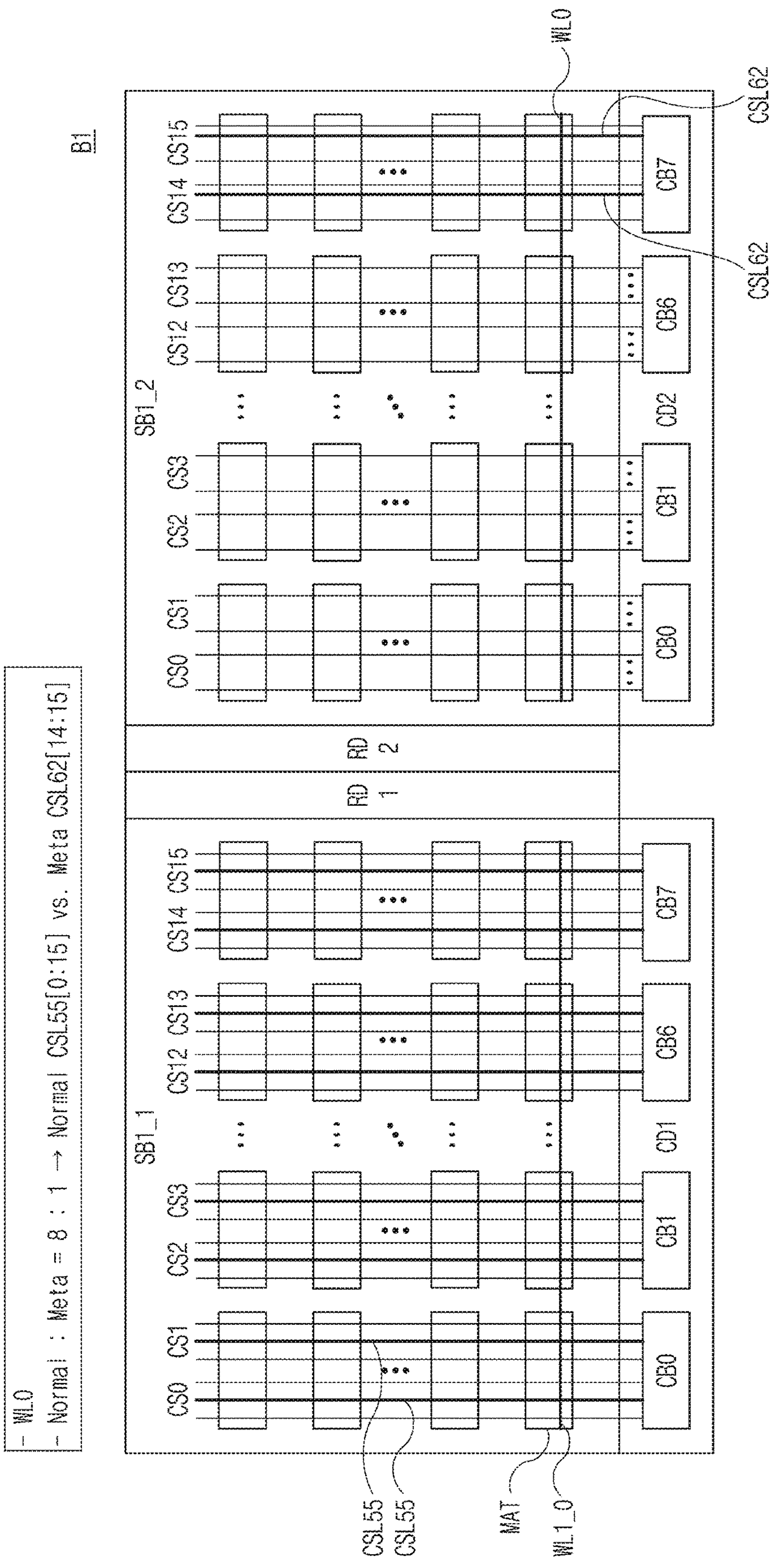

In FIG. 16A, an example is provided in which a normal data write or read operation is performed on a region corresponding to the 1_0-th wordline WL1_0 and the 55th normal column select line CSL55 of the 1_1-th sub-bank SB1_1.

Figure 16B:
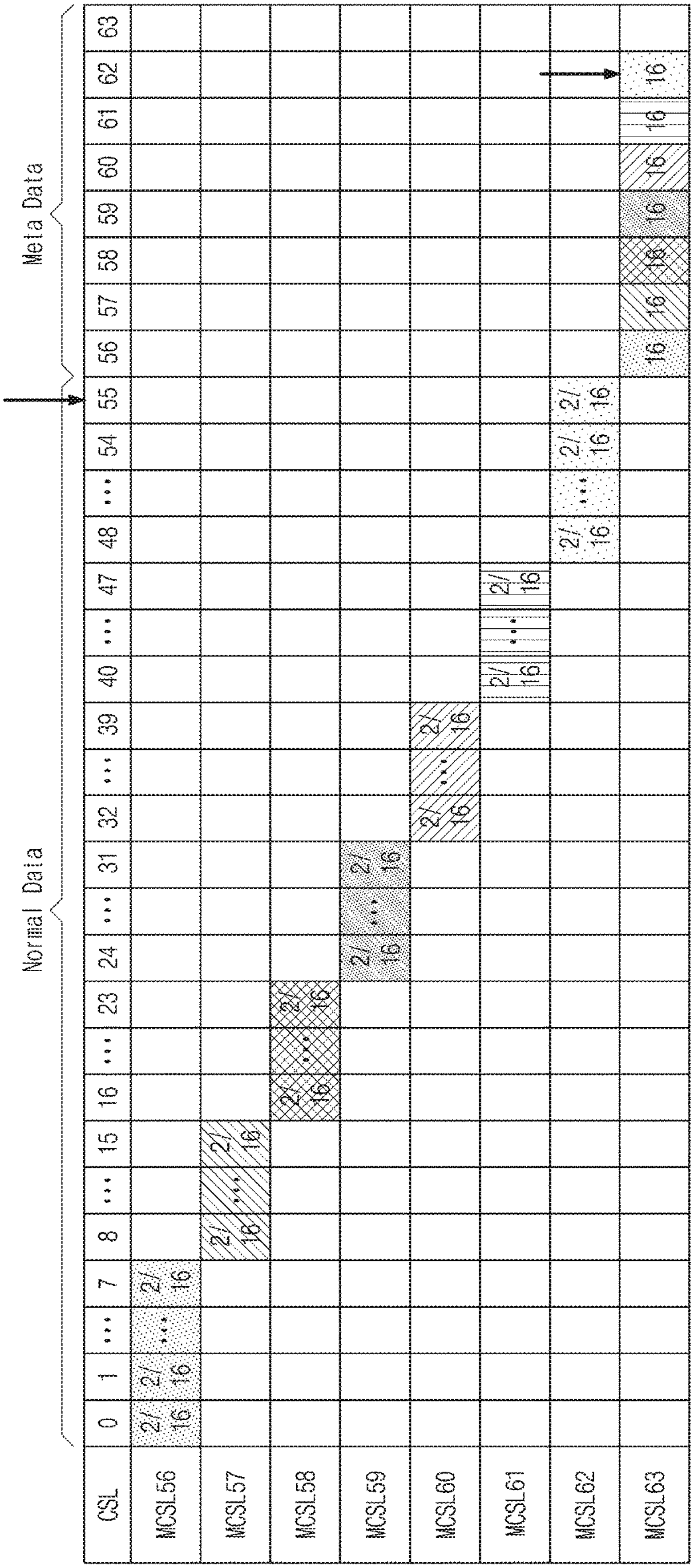

In FIG. 16B, the 55th normal column select line CSL55 may correspond to some subsets of the 62nd meta column select line CSL62.

Accordingly, metadata corresponding to the normal data may be stored in a region corresponding to the 1_0-th wordline WL1_0, the 2_0-th wordline WL2_0 corresponding to the 1_0-th wordline WL1_0 and the 62nd meta column select line CSL62 corresponding to the 55th normal column select line CSL55 within the 2_2-th sub-bank SB2_2.

To this end, the first row decoder RD1 may activate the 1_0-th wordline WL1_0, and the second row decoder RD2 may activate the 2_0-th wordline WL2_0.

A column select signal on a side of the 1_1-th sub-bank SB1_1 may be 'CSL55[0:15].' The first column decoder CD1 may activate the 55th column select line CSL55 in each of the 0th to 15th CSL groups CS0 to CS15.

The second column decoder CD2 may select some subsets of the meta column select line CSL62 corresponding to the 55th normal column select line CSL55. In some implementations, a subset corresponding to the eighth block (for example, CB7) may be selected. In some implementations, the column select signal may be 'CSL62[14:15].' In some implementations, the fourteenth and fifteenth CSL groups CS14 and CS15 may be selected, and the 62nd column select line CSL62 may be selected in each of the fourteenth and fifteenth CSL groups CS14 and CS15. Since the seventh CSL block CB7 corresponds to the fourteenth and fifteenth CSL groups CS14 and CS15, the seventh CSL block CB7 of the 2_1-th sub-bank SB2_1 may activate two 62nd column select lines CSL62.

Accordingly, normal data may be written in or read from a region corresponding to the 1_0-th wordline WL1_0 and the 55th normal column select line CSL55 from the 1_1-th sub-bank SB1_1, and metadata corresponding to the normal data may be written in or read from a region corresponding to the 2_0-th wordline WL2_0 and another subset of the 62nd meta column select lines CSL62 from the 2_1-th sub-bank SB2_1. Such write or read operations of normal data and metadata may be performed substantially simultaneously.

FIGS. 17 to 20 are diagrams illustrating an example of an CSL assignment to metadata during a write or read operation of normal data for the 1_1-th wordline WL1_1 according to some implementations. The CSL assignment method on a single wordline, described in reference to FIGS. 13 to 16, may be similarly applied to other wordlines. Accordingly, for ease of description, redundant descriptions will be omitted.

Figure 17:
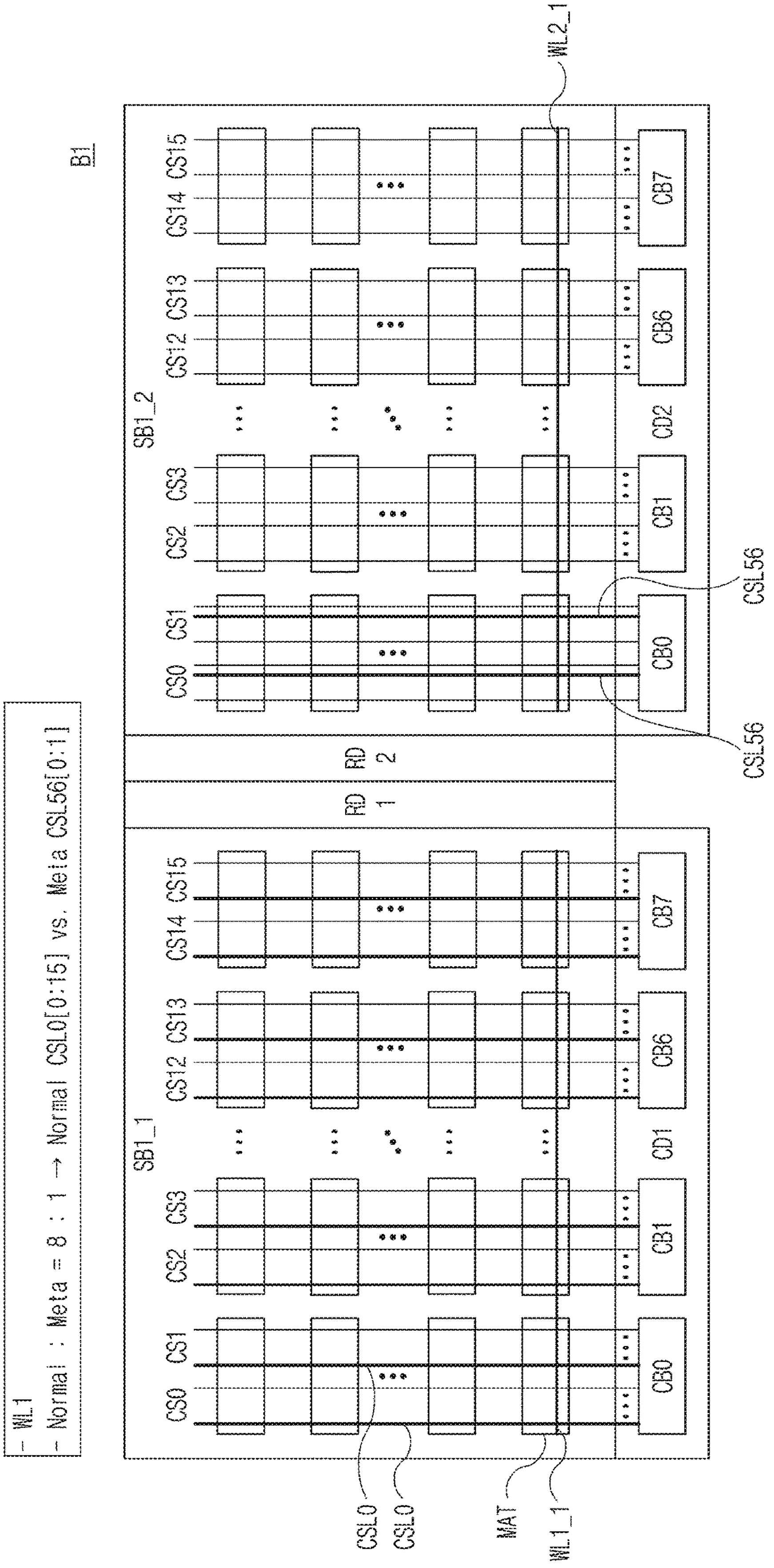
FIGS. 17 to 20 are diagrams illustrating examples of assignments of CSLs during normal data write or read operations on a single wordline according to some implementations.

In FIG. 17, an example is provided in which a normal data write or read operation is performed on a region corresponding to the 1_1-th wordline WL1_1 and the 0th normal column select line CSL0 of the 1_1-th sub-bank SB1_1.

The above-described metadata for the normal data may be stored in a region, corresponding to some subsets of the 2_1-th wordline WL2_1 corresponding to the 1_1-th wordline WL1_1 and the 56th metal column select line CSL56 corresponding to the 0th normal column select line CSL0, in the 2_2-th sub-bank SB2_22.

To this end, the first row decoder RD1 may activate the 1_1-th wordline WL1_1, and the second row decoder RD2 may activate the 2_1-th wordline WL2_1.

A column select signal on a side of the 1_1-th sub-bank SB1_1 may be 'CSL0[0:15].' The first column decoder CD1 may activate the 0th column select line CSL0 in each of the 0th to 15th CSL groups CS0 to CS15.

The second column decoder CD2 may select some subsets of the 56th meta column select line CSL56 corresponding to the 0th normal column select line CSL0. In some implementations, the column select signal may be 'CSL56[0:1].' In some implementations, the 0th and first CSL groups CS0 and CS1 may be selected, and the 56th CSL56 may be activated in each of the 0th and first CSL groups CS0 and CS1.

Accordingly, normal data may be written in or read from a region corresponding to the 1_1-th wordline WL1_1 and the 0th normal column select line CSL0 from the 1_1-th sub-bank SB1_1, and metadata corresponding to the normal data may be written in or read from a region corresponding to the 2_1-th wordline WL2_1 and a single subset of the 56th meta column select lines CSL56 from the 2_1-th sub-bank SB2_1.

Figure 18:
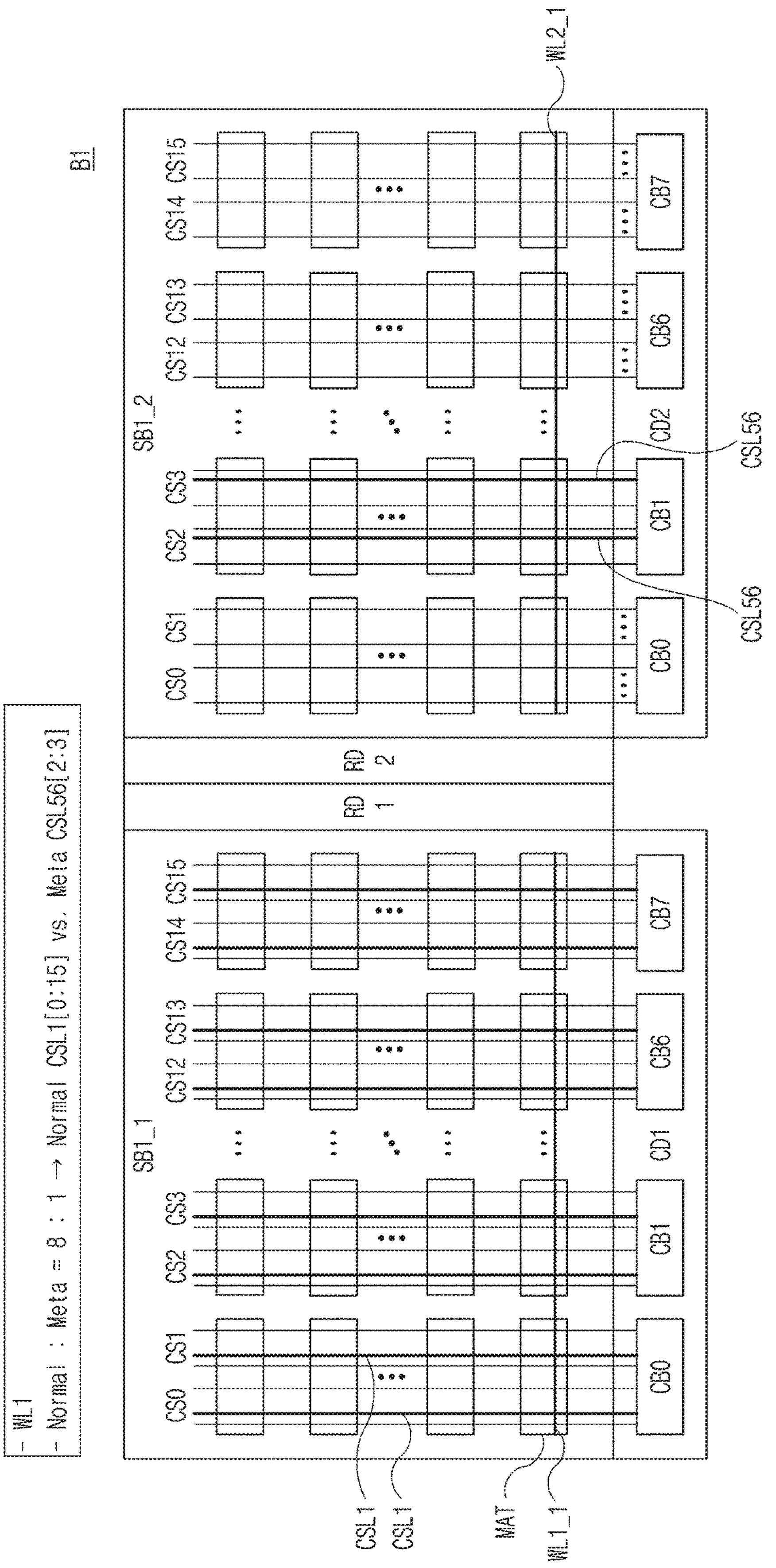

In FIG. 18, an example is provided in which a normal data write or read operation is performed on a region corresponding to the 1_1-th wordline WL1_1 and the first normal column select line CSL1 of the 1_1-th sub-bank SB1_1.

The above-described metadata for the normal data may be stored in a region, corresponding to a subset of the 2_1-th wordline WL2_1 corresponding to the 1_1-th wordline WL1_1 and the 56th metal column select line CSL56 corresponding to the first normal column select line CSL1, within the 2_2-th sub-bank SB2_22.

To this end, the first row decoder RD1 may activate the 1_1-th wordline WL1_1, and the second row decoder RD2 may activate the 2_1-th wordline WL2_1.

A column select signal on a side of the 1_1-th sub-bank SB1_1 may be 'CSL1[0:15].' The first column decoder CD1 may activate the first column select line CSL1 in each of the 0th to 15th CSL groups CS0 to CS15.

The second column decoder CD2 may select some subset of the 56th meta column select line CSL56 corresponding to the first normal column select line CSL1. In some implementations, the column select signal may be 'CSL56[2:3].' In some implementations, the second and third CSL groups CS2 and CS3 may be selected, and the 56th column select line CSL56 may be activated in each of the second and third CSL groups CS2 and CS3.

Accordingly, normal data may be written in or read from a region corresponding to the 1_1-th wordline WL1_1 and the 0th normal column select line CSL0 from the 1_1-th sub-bank SB1_1, and metadata corresponding to the normal data may be written in or read from a region corresponding to the 2_1-th wordline WL2_1 and another subset of the 56th meta column select lines CSL56 from the 2_1-th sub-bank SB2_1.

Figure 19:
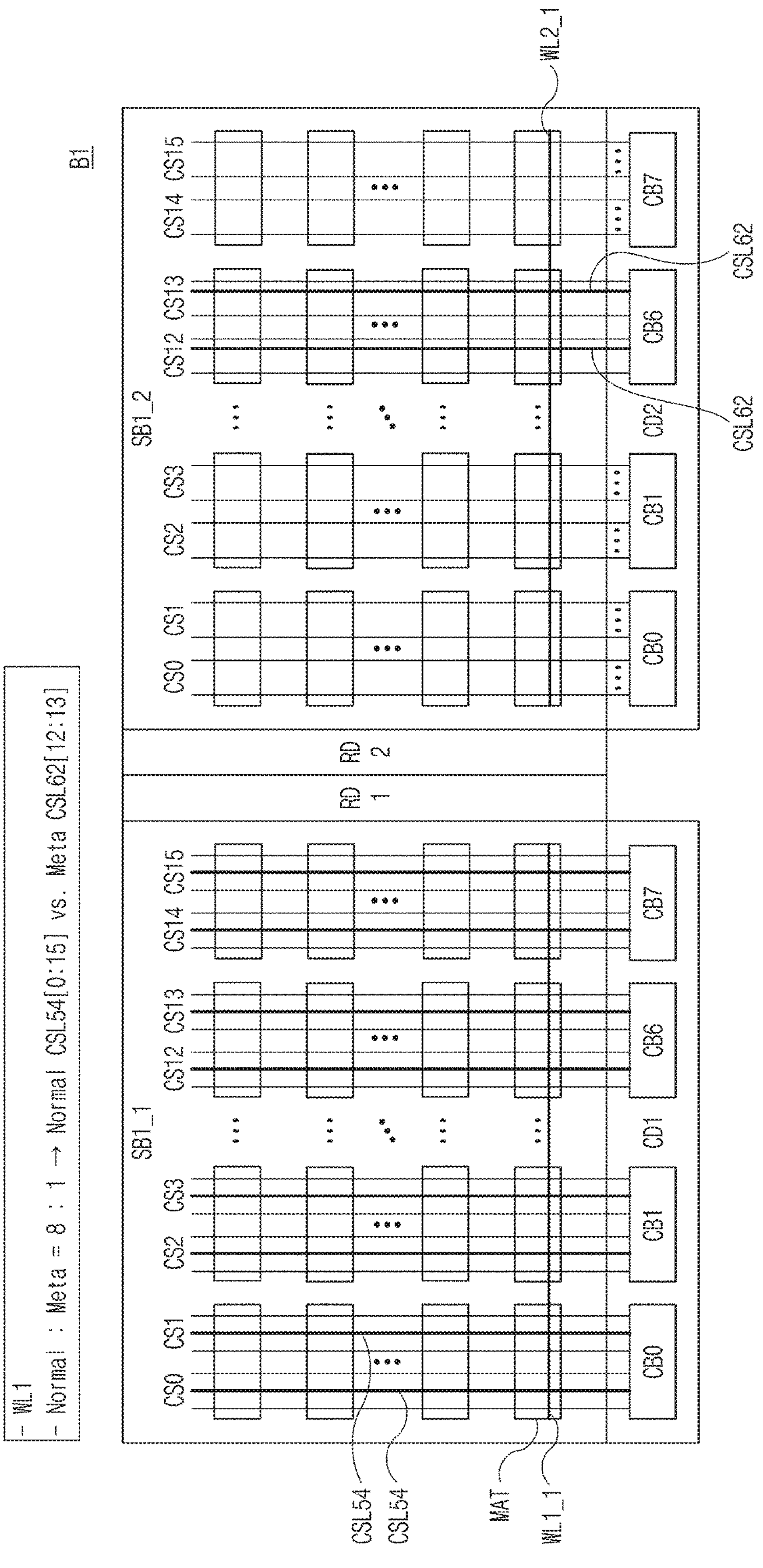

In FIG. 19, an example is provided in which a normal data write or read operation is performed on a region corresponding to the 1_1-th wordline WL1_1 and the 54th normal column select line CSL54 of the 1_1-th sub-bank SB1_1.

Metadata for the normal data may be stored in a region corresponding to the 2_1-th wordline WL2_1 corresponding to the 1_1-th wordline WL1_1 and some subsets of the 62nd meta column select line CSL62 corresponding to the 54th normal column select line CSL54 within the 2_2-th sub-bank SB2_2.

To this end, the first row decoder RD1 may activate the 1_1-th wordline WL1_1, and the second row decoder RD2 may activate the 2_1-th wordline WL2_1.

A column select signal on a side of the 1_1-th sub-bank SB1_1 may be 'CSL54[0:15].' The first column decoder CD1 may activate the 54th column select line CSL54 in each of the 0th to 15th CSL groups CS0 to CS15.

The second column decoder CD2 may select some subsets of the 62nd meta column select line CSL62 corresponding to the 54th normal column select line CSL54. In some implementations, the column select signal may be 'CSL62[12:13].' In some implementations, the second and third CSL groups CS2 and CS3 may be selected, and the 62nd column select line CSL62 may be activated in each of the twelfth and thirteenth CSL groups CS12 and CS13.

Accordingly, normal data may be written in or read from a region corresponding to the 1_1-th wordline WL1_1 and the 54th normal column select line CSL54 from the 1_1-th sub-bank SB1_1, and metadata corresponding to the normal data may be written in or read from a region corresponding to the 2_1-th wordline WL2_1 and a single subset of the 62nd meta column select lines CSL62 from the 2_1-th sub-bank SB2_1.

Figure 20:
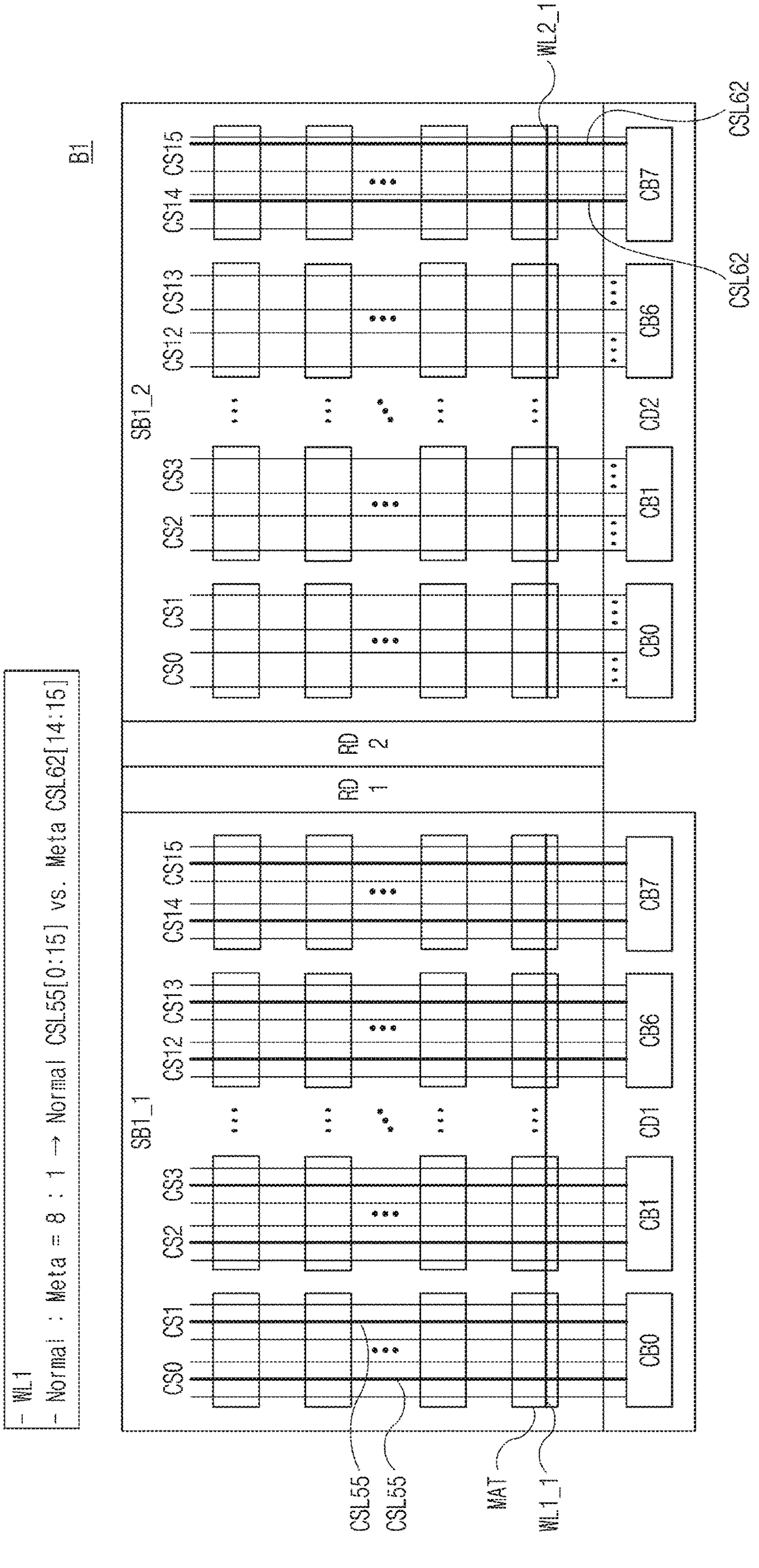

In FIG. 20, an example is provided in which a normal data write or read operation is performed on a region corresponding to the 1_1-th wordline WL1_1 and the 55th normal column select line CSL55 of the 1_1-th sub-bank SB1_1.

Metadata for the normal data may be stored in a region corresponding to the 2_1-th wordline WL2_1 corresponding to the 1_1-th wordline WL1_1 and a subset of a portion of the 62nd meta column select lines CSL62 corresponding to the 54th normal column select line CSL54 within the 2_2-th sub-bank SB2_2.

To this end, the first row decoder RD1 may activate the 1_1-th wordline WL1_1, and the second row decoder RD2 may activate the 2_1-th wordline WL2_1.

A column select signal on a side of the first sub-bank SB1_1 may be 'CSL55[0:15].' The first column decoder CD1 may activate the 55th column select line CSL55 in each of the 0th to 15th CSL groups CS0 to CS15.

The second column decoder CD2 may select some subsets of the 62nd meta column select line CSL62 corresponding to the 55th normal column select line CSL55. In some implementations, the column select signal may be 'CSL62[14:15].' In some implementations, the fourteenth and fifteenth CSL groups CS14 and CS15 may be selected, and the 62nd column select line CSL62 may be activated in each of the fourteenth and fifteenth CSL groups CS14 and CS15.

Accordingly, normal data may be written in or read from a region corresponding to the 1_1-th wordline WL1_1 and the 55th normal column select line CSL54 from the 1_1-th sub-bank SB1_1, and metadata corresponding to the normal data may be written in or read from a region corresponding to the 2_1-th wordline WL2_1 and another subset of the 62nd meta column select lines CSL62 from the 2_1-th sub-bank SB2_1.

According to some implementations, some subsets of the corresponding meta column select line may be assigned for metadata to correspond to a single normal column select line. Accordingly, additional chip size overhead may be reduced. In some implementations, metadata for normal data stored in a single sub-bank may be distributed and stored in corresponding wordlines in another sub-bank, and may not be concentrated and stored in a specific wordline in another sub-bank. Accordingly, a row hammer effect caused by repeated access to a specific wordline to access metadata may be reduced.

Figure 21:
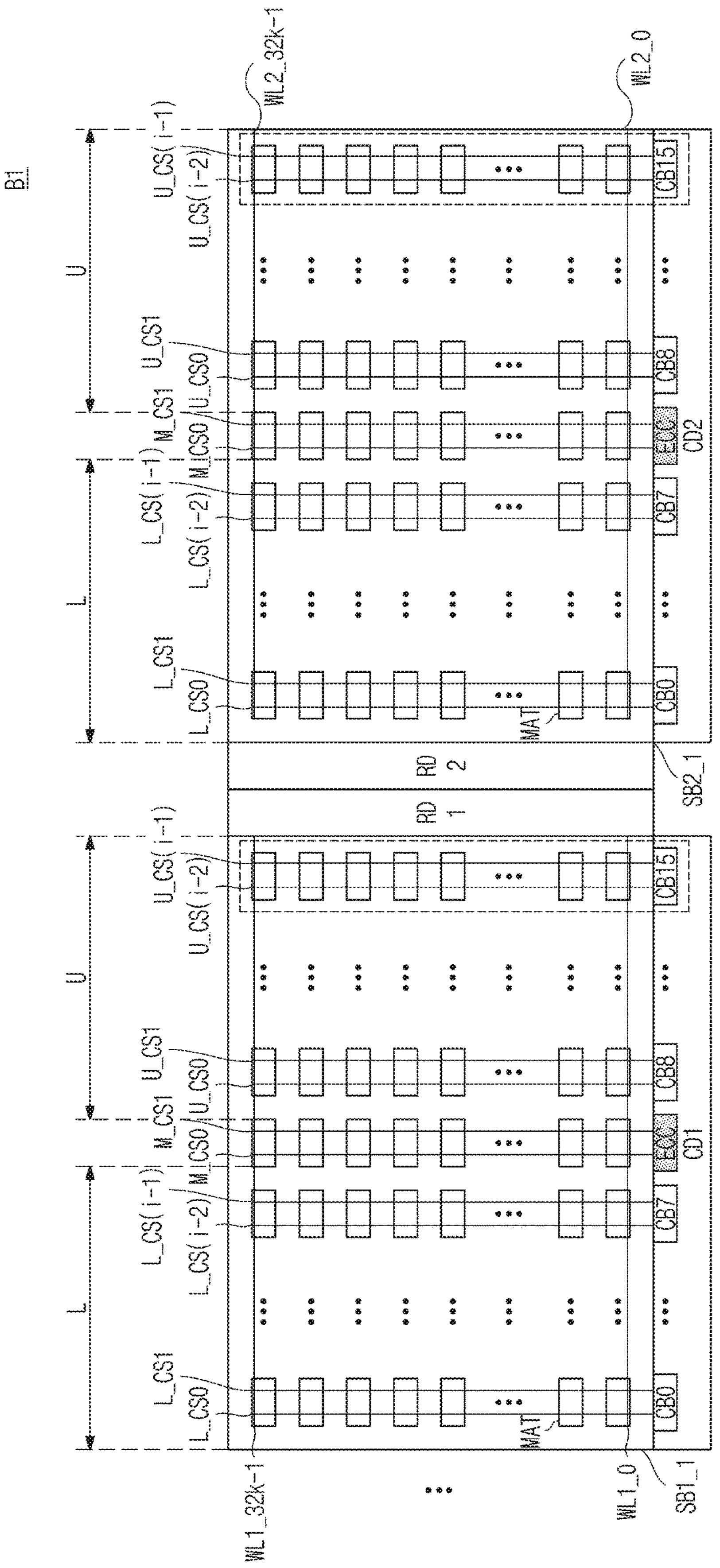
FIG. 21 is a diagram illustrating an example of a bank according to some implementations.

FIG. 21 is a diagram illustrating an example of a bank according to some implementations. A first bank B1 of FIG. 21 may correspond to one of the first banks B1 described in FIGS. 1 to 8.

In FIG. 21, a 1_1-th sub-bank SB1_1 may be electrically connected to a first row decoder RD1 and a first column decoder CD1. The 1_1-th sub-bank SB1_1 may be connected to a plurality of wordlines WL1_0 to WL1_32*k*−1 through the first row decoder RD1. In addition, the 1_1-th sub-bank SB1_1 may be connected to a plurality of CSL subsets L_CS0 to U_CSi−1 through the first column decoder CD1.

A 2_1-th sub-bank SB2_1 may be electrically connected to a second row decoder RD2 and a second column decoder CD2. The 2_1-th sub-bank SB2_1 may be connected to a plurality of wordlines WL2_0 to WL2_32*k*−1 through the second row decoder RD2. In addition, the 2_1-th sub-bank SB2_1 may be connected to a plurality of CSL subsets L_CS0 to U_CSi−1 through the second column decoder CD2.

Each of the 1_1-th sub-bank SB1_1 and the 2_1-th sub-bank SB2_1 may include a plurality of mats MATs. A portion of wordlines and a portion of column select lines may be connected to each MAT. Each MAT includes a plurality of memory cells, and each memory cell may be connected to one of the portion of wordlines connected to the corresponding mat MAT and one of the portion of column select lines connected to the corresponding mat MAT.

Referring to FIG. 21, each sub-bank may include a plurality of CSL blocks CB0 to CB15 and a single error correction code (ECC) block. In FIG. 21, 16 CSL blocks per sub-block are illustrated. Each CSL block and each ECC block may be configured to select a CSL based on a column address decoded by a column decoder CD. The CSL blocks CB0 to CB15 and the ECC block may be disposed along a column corresponding to the CSL. For example, among the plurality of mats MATs, mats MATs connected to the columns corresponding to the ECC block may store parity bits parity bit generated from the ECC block.

In some implementations, the ECC block may be disposed to correspond to a middle column among a plurality of columns formed by a plurality of mats MATs included in a sub-bank SB. For example, for a single sub-bank SB, a plurality of CSL blocks CSL may be disposed symmetrically with respect to the ECC block. Accordingly, column select lines CSLs connected to the plurality of CSL blocks CSL may also be disposed symmetrically with respect to the column select line CSL connected to the ECC block.

A plurality of CSL subsets L_CS0 to U_CSi−1 may be connected to a plurality of MATs MATs corresponding to a single CSL block. As illustrated, a CSL subset may be selected from among the plurality of CSL subsets L_CS0 to U_CSi−1 during one access. In some implementations, a pair of CSL subsets L_CS0 and L_CS1 to a pair of CSL subsets L_CSi−2 and L_CSi−1 (where i is a positive integer) may be selected on a first side L with respect to the ECC block, and a pair of CSL subsets U_CS0 and U_CS1 to a pair of CSL subsets U_CSi−2 and U_CSi−1 may be selected on a second side U with respect to the ECC block. In some implementations, a single subset may be selected from among the subset pairs on the first side L and a single subset may be selected from among the subset pairs on the second side U. In addition, a pair of CSL subsets M_CS0 and M_CS1 may be selected for the ECC block.

In FIG. 21, when 8 bitlines are connected per CSL, 256 bits (8 bits×32 (the number of CSLs corresponding to a CSL subset selected for normal data)) of normal data may be output during an access to a single wordline. When a ratio of normal data and metadata is 8:1, 32 bits (8 bits×4 (the number of CSLs corresponding to a CSL subset selected for metadata)) of metadata and 16 bits of parity bits may be output. When the ratio of normal data and metadata is 16:1, 16 bits (8 bits×2 (the number of CSLs corresponding to a CSL subset selected for metadata)) of metadata and 16 bits of parity bits may be output.

Figure 22:
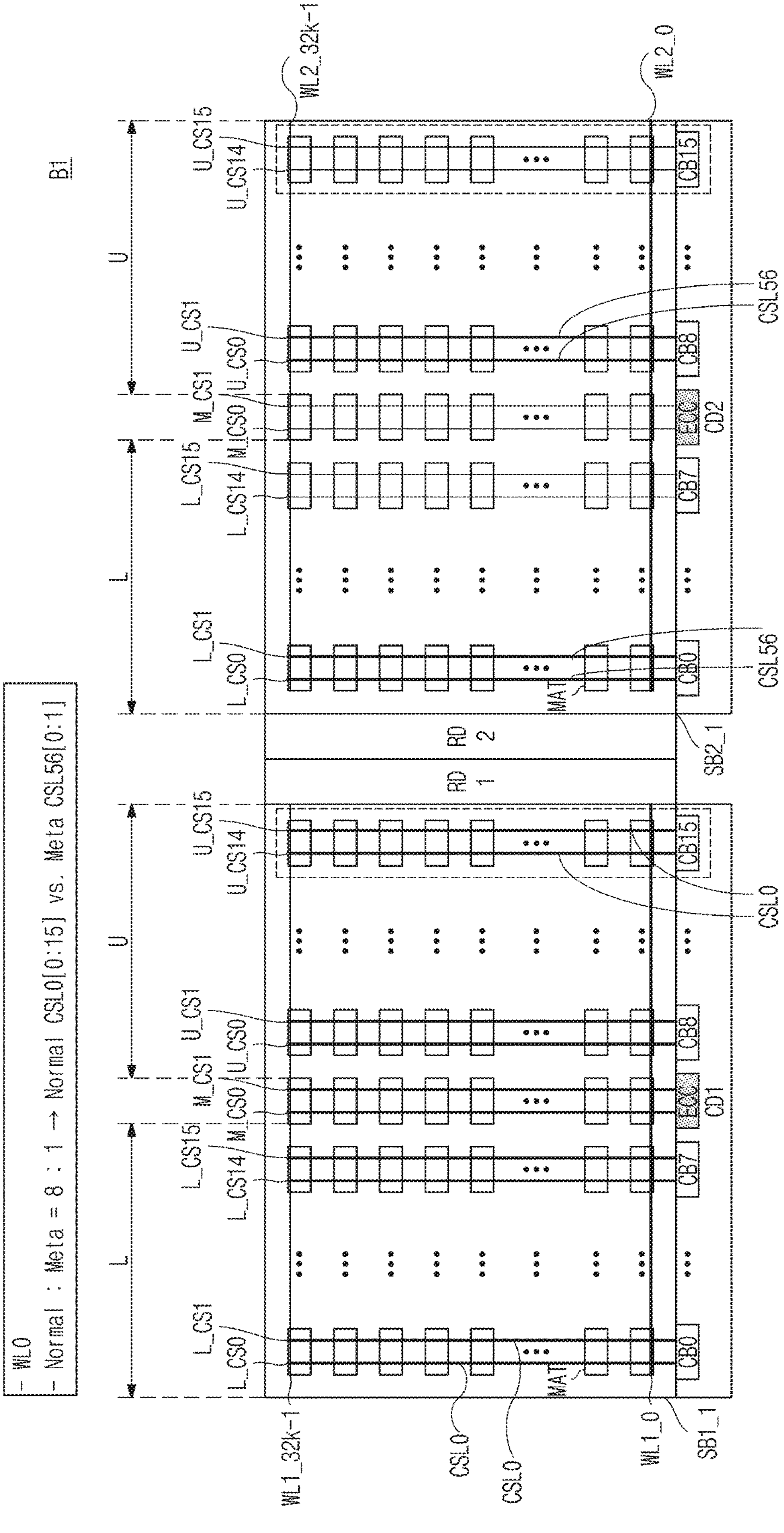
FIGS. 22 and 23 are diagrams illustrating examples of assignments of CSLs during normal data write or read operations on a single wordline in a bank structure of FIG. 21 according to some implementations.
Figure 23:
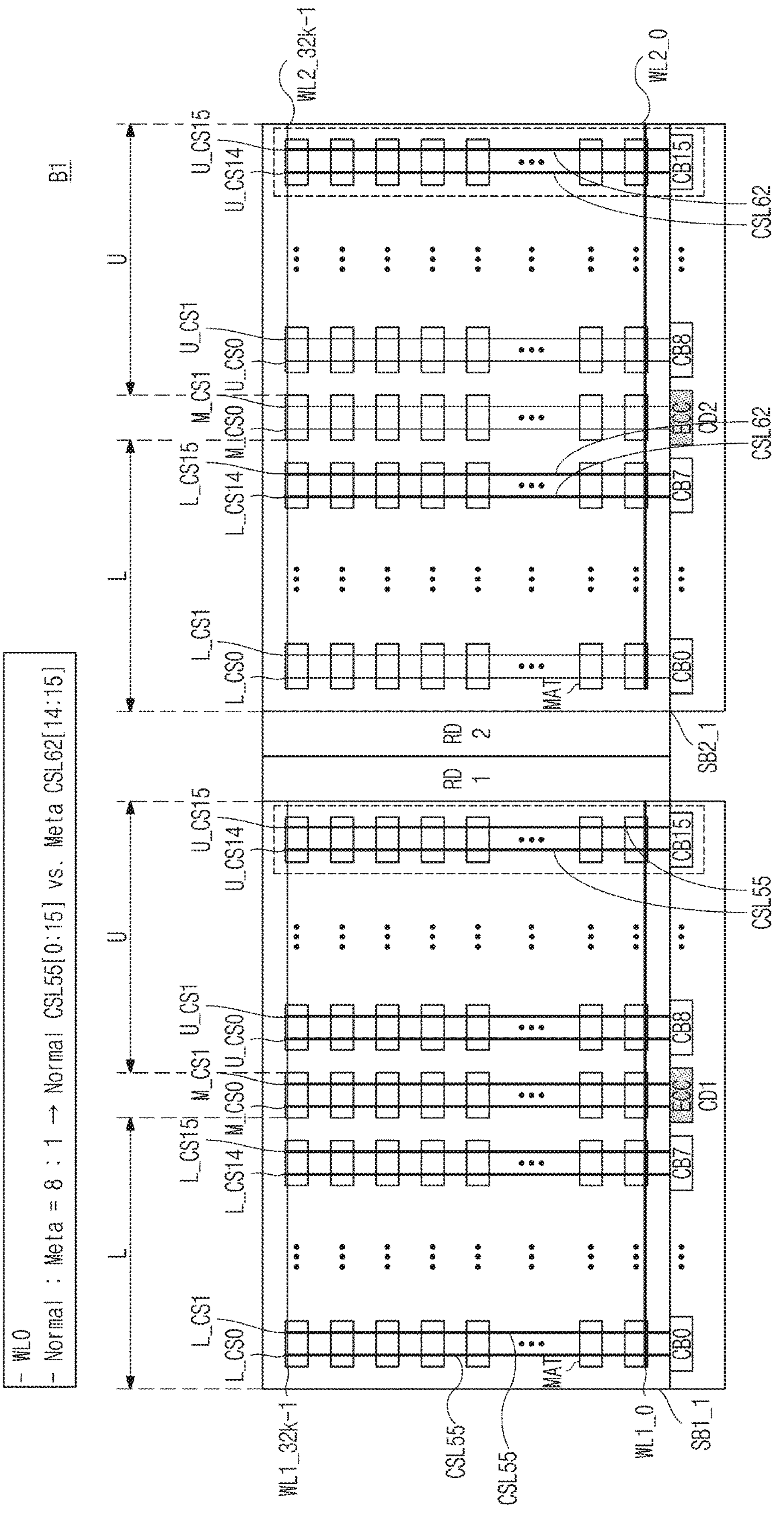

FIGS. 22 and 23 are diagrams illustrating examples of an CSL assignment during a normal data write or read operation on a single wordline (for example, 1_0-th wordline) in the bank structure of FIG. 21 according to some implementations.

For ease of description, an example is provided in which a column select signal is 'CSLx[a:b].' In some implementations, 'x' may refer to the number of column select lines (where x is one of 0 to 63), and '[a:b]' may refer to the range of a selected CSL group. A column select line assigned to normal data is referred to as a normal column select line, and a column select line assigned to metadata is referred to as a meta column select line.

In FIG. 22, an example is provided in which a normal data write or read operation is performed on a region corresponding to a 1_0-th wordline WL1_0 and a 0th normal column select line CSL0 of a 1_1-th sub-bank SB1_1.

In some implementations, the 0th normal column select line CSL0 may correspond to some subsets of the 56th meta column select line CSL56.

Accordingly, metadata corresponding to the normal data may be stored in a region corresponding to a 2_0-th wordline WL2_0 corresponding to a 1_0-th wordline WL1_0 and some subsets of a 56th metal column select line CSL56 corresponding to a 0th normal column select line CSL0.

To this end, a first row decoder RD1 may activate the 1_0-th wordline WL1_0, and a second row decoder RD2 may activate the 2_0-th wordline WL2_0.

A column select signal on a side of the 1_1-th sub-bank SB1_1 may be 'CSL0[0:15].' A first column decoder CD1 may activate all CSL subsets L_CS0 to U_CS15 corresponding to the 0th normal column select line CSL0.

A second column decoder CD2 may select some subset of a 56th meta column select line CSL56 corresponding to the 0th normal column select line CSL0. In some implementations, a subset pair corresponding to a first block of each of a first side L and a second side U may be selected. In some implementations, the column select signal may be 'CSL56[0:1].' In some implementations, the 56th column select line CSL56 may be selected from among first two groups L_CS0 and L_CS1 on the first side L, and the 56th column select line CSL56 may be selected from among first two groups U_CS0 and U_CS1 on the second side U.

Accordingly, normal data may be written in or read from a region corresponding to the 1_0-th wordline WL1_0 and the 0th normal column select line CSL0 from the 1_1-th sub-bank SB1_1, and metadata corresponding to the normal data may be written in or read from a region corresponding to a subset pair of the 2_0-th wordline WL2_0 and the 56th meta column select line CSL56 from the 2_1-th sub-bank SB2_1. Such write or read operation of normal data and metadata may be performed substantially simultaneously.

In FIG. 23, an example is provided in which a normal data write or read operation is performed on a region corresponding to a 1_0-th wordline WL1_0 and a 55th normal column select line CSL55 of a 1_1-th sub-bank SB1_1.

In some implementations, the 55th normal column select line CSL55 may correspond to a subset of a 62nd meta column select line CSL62.

Accordingly, metadata for the normal data may be stored in a region corresponding to a 2_0-th wordline WL2_0 corresponding to the 1_0-th wordline WL1_0 and some subsets of the 62nd meta column select line CSL62, within a 2_2-th sub-bank SB2_2.

To this end, a first row decoder D1 may activate the 1_0-th wordline WL1_0, and a second row decoder D2 may activate the 2_0-th wordline WL2_0.

A column select signal on a side of the 1_1-th sub-bank SB1_1 may be 'CSL55[0:15].' A first column decoder CD1 may activate all CSL subsets L_CS0 to U_CS15 corresponding to the 55th normal column select line CSL55.

A second column decoder CD2 may select some subsets of the 62nd meta column select lines CSL62 corresponding to the 0th normal column select line CSL0. In some implementations, a subset pair corresponding to an eighth block of each of a left side L and a right side U may be selected. In some implementations, the column select signal may be 'CSL62[14:15].' In some implementations, the 62nd column select line CSL62 may be selected from two groups L_CS14 and L_CS15 on the first side L, and the 62nd column select line CSL62 may be selected from the two groups U_CS14 and U_CS15 on the second side U.

Accordingly, normal data may be written in or read from a region corresponding to the 1_0-th wordline WL1_0 and the 0th normal column select line CSL0 from the 1_1-th sub-bank SB1_1, and metadata corresponding to the normal data may be written in or read from a region corresponding to a 2_0-th wordline WL2_0 and a single subset of the 62nd meta column select line CSL62 from the 2_1-th sub-bank SB2_1. Such write or read operation of normal data and metadata may be performed substantially simultaneously.

FIGS. 22 and 23 illustrate an example in which, among CSL subsets connected to a single sub-bank SB, one of the CSL subsets L_CS0 to L_CSi−1 included in the first side L and one of the CSL subsets U_CS0 to U_CSi−1 are sequentially selected for a metal column select line. In some implementations, four CSLs may be activated from a corresponding CSL group for a single meta column select line. However, some implementations are not limited thereto and may vary depending on a required ratio of normal data and metadata and a structure of the sub-bank. In some implementations, among CSL subsets connected to a single sub-bank SB, one of the CSL subsets L_CS0 to L_CSi−1 included in the first side L and one of the CSL subsets U_CS0 to U_CSi−1 may be sequentially selected from a CSL subset having a lowest index. In some implementations, two CSLs may be activated for a single meta column select line.

As set forth above, a memory device according to some implementations may reduce an increase in area caused by assignment of metadata or a row hammer effect for access to the metadata. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "connected to" "coupled to," "connected with," or "coupled with," another element (e.g., a second element), it means that the element may be coupled with the other element directly (e.g., wired), wirelessly, or via a third element.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A memory device comprising:

at least one bank comprising a first sub-bank and a second sub-bank disposed in a wordline direction, wherein the first sub-bank is configured to store normal data and is connected to a plurality of first wordlines, wherein the second sub-bank is configured to store metadata corresponding to the normal data and is connected to a plurality of second wordlines, wherein metadata for normal data corresponding to each of the plurality of first wordlines is configured to be stored in each of the plurality of second wordlines that correspond to the plurality of first wordlines, respectively, wherein each of the first and second sub-banks is connected to p column select lines, p being a positive integer greater than or equal to 2, wherein a first portion of the p column select lines are assigned to a region in which the normal data of the first sub-bank is stored, as normal column select lines, and wherein a second portion of the p column select lines are assigned to a region in which the metadata of the second sub-bank is stored, as meta column select lines.

2. The memory device of claim 1, wherein based on a write or read operation being performed on normal data in the first sub-bank, a write or read is performed on metadata corresponding to the normal data in the second sub-bank.

3. The memory device of claim 1, wherein, among the p column select lines connected to the first sub-bank, remaining column select lines other than the normal column select lines are assigned to metadata corresponding to normal data stored in the second sub-bank, and wherein, among the p column select lines connected to the second sub-bank, remaining column select lines other than the meta column select lines are assigned to normal data stored in the second sub-bank.

4. The memory device of claim 1, wherein a ratio of the normal column select lines to the meta column select lines is based on a ratio of the normal data and the metadata.

5. The memory device of claim 4, wherein each of the p column select lines corresponds to n CSL groups (where n is a positive integer), and a corresponding column select line is configured to be activated in each of the n CSL groups based on a normal column select line being selected.

6. The memory device of claim 5, wherein, when the ratio of the normal data and the metadata is k:1, each of the normal column select lines corresponds to a single subset, among k subsets of a corresponding single meta column select line, and wherein each of the k subsets corresponds to column select lines activated in a portion of CSL groups, among a plurality of CSL groups corresponding to a single meta column select line.

7. The memory device of claim 6, wherein each of the k subsets sequentially corresponds to column select lines activated in each of n/k CSL groups, among the plurality of CSL groups corresponding to the single meta column select line.

8. The memory device of claim 7, wherein k is 8 or 16.

9. The memory device of claim 1, further comprising:

a first row decoder configured to select one of the plurality of first wordlines and a first column decoder connected to the p column select lines on a side of the first sub-bank; and a second row decoder configured to select one of the plurality of second wordlines and a second column decoder connected to the p column select lines on a side of the second sub-bank.

10. The memory device of claim 9, wherein the second row decoder is configured to select a single second wordline corresponding to a single first wordline from among the second wordlines, based on the first row decoder selecting the single first wordline from among the first wordlines.

11. The memory device of claim 10, wherein, when a ratio of the normal data and the metadata is k:1, the second column decoder is configured to select a single subset from among k subsets of a single meta column select line corresponding to a normal column select line based on the first column decoder selecting the normal column select line, and wherein each of the k subsets corresponds to column select lines activated in a portion of CSL groups among a plurality of CSL groups corresponding to a single meta column select line.

12. The memory device of claim 1, wherein the at least one bank is connected to a plurality of global input/output (GIO) lines, and wherein the first and second sub-banks are connected to different GIO lines.

13. The memory device of claim 1, wherein metadata corresponding to normal data stored in the second sub-bank is configured to be stored in the first sub-bank, and wherein metadata for normal data corresponding to each of the second wordlines is configured to be stored in each of the first wordlines, respectively, corresponding to the second wordlines.

14. A memory device comprising:

at least one bank comprising at least a first sub-bank and a second sub-bank disposed in a wordline direction;

a first row decoder connected to the first sub-bank through a plurality of first wordlines;

a second row decoder connected to the second sub-bank through a plurality of second wordlines;

a first column decoder connected to the first sub-bank through a plurality of first column select lines; and a second column decoder connected to the second sub-bank through a plurality of second column select lines, wherein based on the first row decoder selecting a single first wordline from among the first wordlines to write normal data in the first sub-bank, the second row decoder is configured to select a single second word-line, corresponding to the single first wordline, from among the second wordlines to write metadata corresponding to the normal data, wherein a portion of the first column select lines are configured to be assigned to a region in which the normal data is stored, as normal column select lines, and wherein a portion of the second column select lines are configured to be assigned to a region in which the metadata is stored, as meta column select lines.

15. The memory device of claim 14, wherein, when a ratio of the normal data to the metadata is k:1, metadata for normal data corresponding to k normal column select lines corresponds to a single meta column select line, and the second column decoder is configured to select a single subset from among k subsets of a single meta column select line corresponding to a normal column select line based on the first column decoder selecting the normal column select line, and wherein each of the k subsets corresponds to column select lines configured to be activated in a portion of CSL groups among n CSL groups corresponding to a single meta column select line.

16. The memory device of claim 15, wherein each of the k subsets sequentially corresponds to column select lines configured to be activated in each of n/k CSL groups, among the n CSL groups corresponding to the single meta column select line.

17. A memory system comprising:

a memory device comprising at least one bank comprising at least a first sub-bank and a second sub-bank disposed in a wordline direction; and a memory controller configured to control the memory device, wherein the first sub-bank is configured to store normal data and is connected to a plurality of first wordlines, wherein the second sub-bank is configured to store metadata corresponding to the normal data and is connected to a plurality of second wordlines, wherein metadata for normal data corresponding to each of the plurality of first wordlines is stored in each of the plurality of second wordlines, respectively corresponding to the plurality of first wordlines, wherein each of the first and second sub-banks is connected to p column select lines, p being a positive integer greater than or equal to 2, wherein a first portion of the p column select lines are assigned to a region in which the normal data of the first sub-bank is stored, as normal column select lines, and wherein a second portion of the p column select lines are assigned to a region in which the metadata of the second sub-bank is stored, as meta column select lines.

* * * * *